(12) United States Patent
Kim et al.

(10) Patent No.: US 11,855,123 B2
(45) Date of Patent: Dec. 26, 2023

(54) DISPLAY DEVICE

(71) Applicant: Samsung Display Co., Ltd., Yongin-si (KR)

(72) Inventors: Woongsik Kim, Hwaseong-si (KR); Saehee Han, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/548,000

(22) Filed: Dec. 10, 2021

(65) Prior Publication Data

US 2022/0102424 A1 Mar. 31, 2022

Related U.S. Application Data

(62) Division of application No. 16/507,046, filed on Jul. 10, 2019, now Pat. No. 11,217,624.

(30) Foreign Application Priority Data

Oct. 2, 2018 (KR) .......................... 10-2018-0117271

(51) Int. Cl.
| | | |
|---|---|---|
| *H01L 27/15* | (2006.01) | |
| *H01L 33/60* | (2010.01) | |
| *H01L 33/40* | (2010.01) | |
| *H01L 33/44* | (2010.01) | |
| *H01L 33/52* | (2010.01) | |

(52) U.S. Cl.
CPC .......... *H01L 27/156* (2013.01); *H01L 33/405* (2013.01); *H01L 33/44* (2013.01); *H01L 33/52* (2013.01); *H01L 33/60* (2013.01)

(58) Field of Classification Search
None
See application file for complete search history.

(56) References Cited

U.S. PATENT DOCUMENTS

| | | | |
|---|---|---|---|
| 8,698,147 B2 * | 4/2014 | Choi | ................... H01L 29/4908 |
| | | | 257/305 |
| 9,774,011 B2 | 9/2017 | Choi et al. | |
| 10,062,675 B2 | 8/2018 | Chang et al. | |
| 10,084,024 B2 | 9/2018 | Choi et al. | |
| 10,090,335 B2 * | 10/2018 | Kang | ................... H01L 33/505 |
| 10,224,377 B2 | 3/2019 | Park et al. | |

(Continued)

FOREIGN PATENT DOCUMENTS

| | | |
|---|---|---|
| KR | 10-2010-0073228 | 7/2010 |
| KR | 10-1018331 | 3/2011 |

(Continued)

*Primary Examiner* — Long Pham

(74) *Attorney, Agent, or Firm* — KILE PARK REED & HOUTTEMAN PLLC

(57) ABSTRACT

A display device including a base layer, a pixel circuit layer disposed on the base layer and including a pixel circuit and a plurality of insulation layers, a first electrode electrically connected to the pixel circuit, a second electrode spaced apart from the first electrode, a light emitting element electrically connected to the first electrode and the second electrode, a first refraction layer disposed on the pixel circuit layer and having a first refractive index, and a second refraction layer disposed on the light emitting element and having a second refractive index larger than the first refractive index.

5 Claims, 14 Drawing Sheets

(56) References Cited

U.S. PATENT DOCUMENTS

| | | | |
|---|---|---|---|
| 2016/0087018 A1* | 3/2016 | Shim | H10K 50/865 257/40 |
| 2018/0090058 A1 | 3/2018 | Chen et al. | |
| 2019/0165061 A1* | 5/2019 | Jung | H10K 50/858 |
| 2019/0198782 A1 | 6/2019 | Kim et al. | |
| 2020/0105826 A1 | 4/2020 | Kim et al. | |

FOREIGN PATENT DOCUMENTS

| | | |
|---|---|---|
| KR | 10-2016-0017397 | 2/2016 |
| KR | 10-2016-0027608 | 3/2016 |
| KR | 10-2018-0005323 | 1/2018 |
| KR | 10-2018-0009116 | 1/2018 |
| KR | 10-2018-0046494 | 5/2018 |
| KR | 10-2019-0062678 | 6/2019 |
| KR | 10-2019-0078723 | 7/2019 |
| KR | 10-2019-0087689 | 7/2019 |

* cited by examiner

DISPLAY DEVICE

CROSS-REFERENCE TO RELATED APPLICATION(S)

This is a divisional application of U.S. patent application Ser. No. 16/507,046, filed Jul. 10, 2019 (now U.S. Pat. No. 11,217,624), the disclosure of which is incorporated herein by reference in its entirety. U.S. patent application Ser. No. 16/507,046 claims priority to and benefit of Korean Patent Application No. 10-2018-0117271 under 35 U.S.C. § 119, filed on Oct. 2, 2018, in the Korean Intellectual Property Office, the entire contents of which are incorporated herein by reference.

BACKGROUND

Field

Exemplary embodiments of the invention relate to a display device having improved emission efficiency.

Discussion of the Background

A display device may include a light emitting element. The light emitting element may be electrically connected to an electrode and emit light according to a voltage applied to the electrode. The light emitting element may be directly disposed on the electrode, or a separate light emitting element may be transferred onto the electrode. The light emitting element may emit light. The light emitted from the light emitting element may be emitted to the outside of a display panel. When the light emitted to the outside of the display panel is reduced in emission efficiency, luminance of the display panel may be deteriorated, or power for driving the display panel may increase.

The above information disclosed in this Background section is only for understanding of the background of the inventive concepts, and, therefore, it may contain information that does not constitute prior art.

SUMMARY

Exemplary embodiments of the present invention provide a display device having improved emission efficiency.

Additional features of the inventive concepts will be set forth in the description which follows, and in part will be apparent from the description, or may be learned by practice of the inventive concepts.

An exemplary embodiment of the inventive concept provides a display device including: a base layer including a first area and a second area adjacent to the first area; a pixel circuit layer disposed on the base layer and including a pixel circuit and a plurality of insulation layers; a first electrode electrically connected to the pixel circuit; a second electrode spaced apart from the first electrode and disposed on the same layer as the first electrode; a light emitting element electrically connected to the first electrode and the second electrode; a first refraction layer disposed on the pixel circuit layer and having a first refractive index; and a second refraction layer disposed on the light emitting element and having a second refractive index greater than the first refractive index. The first area overlaps the light emitting element and the second refraction layer, and the second area overlaps the first refraction layer.

The light emitting element may include a micro light emitting diode element.

The display device may further include an encapsulation layer covering the light emitting element and the pixel circuit.

The first refraction layer and the second refraction layer may be disposed on the encapsulation layer, the first refraction layer may be disposed to surround the first area on a plane, and the second refraction layer may overlap the first area and the second area.

The display device may further include a light blocking layer disposed on the encapsulation layer to overlap the pixel circuit.

The light blocking layer and the first refraction layer may be disposed adjacent to each other and covered by the second refraction layer.

The first refraction layer may be disposed on the light blocking layer to cover the light blocking layer.

The display device may further include a color filter layer overlapping the first area and disposed between the encapsulation layer and the second refraction layer.

The display device may further include: a light blocking layer disposed on the second refraction layer to overlap the pixel circuit; and a planarization layer disposed on the second refraction layer to cover the light blocking layer and provide a planarization surface.

The display device may further include: a light blocking layer disposed on the second refraction layer to overlap the pixel circuit; and a color filter layer disposed on the second refraction layer and overlapping the first area.

The display device may further include a pattern layer disposed below the encapsulation layer, configured to cover the light emitting element, and having a third refractive index. The encapsulation layer has a fourth refractive index that may be less than the third refractive index.

The display device may further include: a light blocking layer disposed on the second refraction layer to overlap the pixel circuit; and a color filter layer disposed on the second refraction layer to overlap the light emitting element.

The display device may further include: a color filter layer disposed between the encapsulation layer and the second refraction layer to overlap the light emitting element; a light blocking layer disposed on the second refraction layer to overlap the pixel circuit; and a planarization layer configured to cover the light blocking layer and provide a planarization surface.

The display device may further include: a light blocking layer disposed on the encapsulation layer to overlap the pixel circuit; a color filter layer disposed on the encapsulation layer to overlap the light emitting element; and a planarization layer covering the light blocking layer and the color filter layer. The first refraction layer and the second refraction layer may be disposed on the planarization layer.

The second refraction layer may cover the light emitting element, and the first refraction layer may be disposed on the second refraction layer and the pixel circuit layer to cover the second refraction layer.

The outermost surface of the second refraction layer may contact the first refraction layer and has a predetermined curvature.

The display device may further include a light blocking layer, which does not overlap the light emitting element. The light blocking layer may be disposed between the first refraction layer and the pixel circuit layer.

The display device may further include: a color filter layer disposed on the first refraction layer to overlap the light emitting element; and a planarization layer disposed on the first refraction layer to cover the color filter layer.

The display device may further include: a light blocking layer which does not overlap the light emitting element and is disposed on the first refraction layer; a color filter layer disposed on the first refraction layer to overlap the light emitting element; and a planarization layer disposed on the first refraction layer to cover the color filter layer.

A groove may be defined in the pixel circuit layer by an inclined part including an end of each of the plurality of insulation layers, and the light emitting element may be disposed in the groove.

The inclined part may be covered by the first electrode and the second electrode, and each of the first electrode and the second electrode may include a reflective material.

The groove may have a depth greater than a thickness of the light emitting element.

Another exemplary embodiment of the inventive concept provides a display device including: a base layer; a pixel circuit layer disposed on the base layer and including a transistor and insulation layers, each of insulation layers having a groove; a first electrode electrically connected to the transistor; a second electrode spaced apart from the first electrode and configured to receive a power source voltage; a light emitting element electrically connected to the first electrode and the second electrode and disposed in the groove; a first refraction layer overlapping an area adjacent to an emission area on which the light emitting element is disposed and having a first refractive index; and a second refraction layer overlapping the emission area and having a second refractive index greater than the first refractive index.

The first refraction layer may be disposed on the pixel circuit layer, and the second refraction layer may be disposed on the first refraction layer to cover the first refraction layer and provide a planarization surface.

The second refraction layer may be disposed on the light emitting element, and the first refraction layer may be disposed on the second refraction layer to cover the second refraction layer and provide a planarization surface.

The groove may be defined by an inclined part including an end of each of the insulation layers, the first electrode may cover one portion of the inclined part, the second electrode may cover the other portion of the inclined part, and each of the first electrode and the second electrode may include a reflective material.

The groove may have a depth greater than a thickness of the light emitting element.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
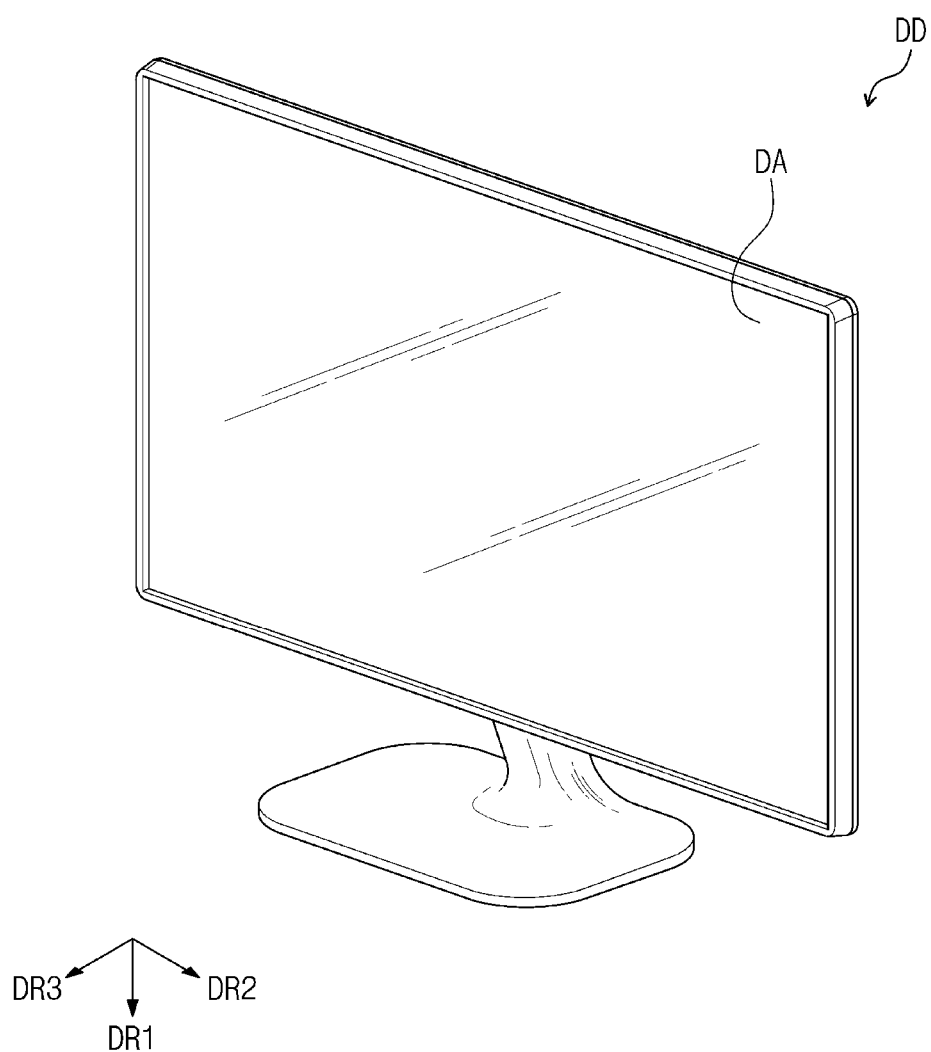
FIG. 1 is a perspective view of a display device according to an exemplary embodiment of the inventive concept.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, or layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z—axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the inventive concept will be described with reference to the accompanying drawings.

FIG. 1 is a perspective view of a display device DD according to an exemplary embodiment of the inventive concept.

Referring to FIG. 1, the display device DD may display an image through a display area DA. FIG. 1 illustrates an example in which the display area DA is provided on a surface defined by a first direction DR1 and a second direction DR2 crossing the first direction DR1. However, a display area of a display device according to another exemplary embodiment of the inventive concept may be provided on a curved surface.

A thickness of the display device DD is indicated in a third direction DR3. The directions indicated as the first to third direction DR1, DR2, and DR3 may be a relative concept and thus changed into different directions. In this specification, "when viewed in a plane view" may mean a view in the third direction DR3. Also, the "thickness direction" may mean the third direction DR3.

FIG. 1 illustrates an example in which the display device DD is a television. However, the display device DD may be applied to large electronic devices such as a monitor, or an external billboard as well as small and middle electronic devices such as a personal computer, a notebook computer, a personal digital terminal, a car navigation unit, a game console, a smart phone, a tablet, and a camera. Also, the above-described devices are merely examples of the inventive concept, and thus, the display device DD may be adopted for other electronic equipment unless departing from the spirit and scope of the invention.

Figure 2:
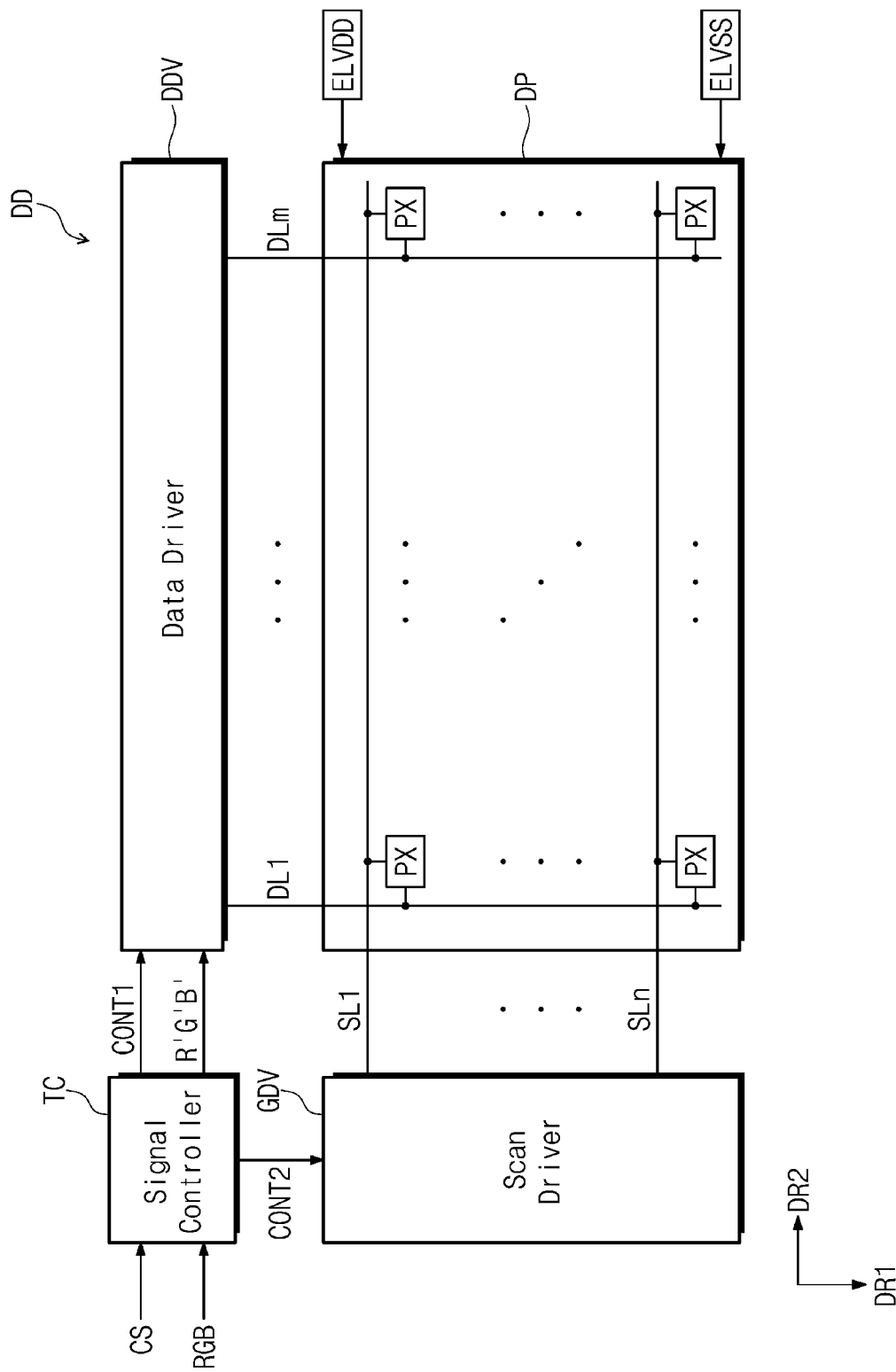
FIG. 2 is a block diagram of the display device according to an exemplary embodiment of the inventive concept.

FIG. 2 is a block diagram of the display device according to an exemplary embodiment of the inventive concept.

Referring to FIG. 2, the display device DD may include a display panel DP, a signal controller TC (or a timing controller), a data driver DDV, and a scan driver GDV. Each of the signal controller TC, the data driver DDV, and the scan driver GDV may include a circuit.

The display panel DP may be a micro light emitting element display panel DP including a micro light emitting element. For example, the display panel DP may be a micro LED display panel DP.

The display panel DP may include a plurality of data lines DL1 to DLm, a plurality of scan lines SL1 to SLn, and a plurality of pixels PX.

The plurality of data lines DL1 to DLm may extend in the first direction DR1 and be arranged in the second direction DR2 crossing the first direction DR1. The plurality of scan lines SL1 to SLn may extend in the second direction DR2 and be arranged in the first direction DR1.

Each of the pixels PX may include a light emitting element ED (see FIG. 3) and a pixel circuit PXC (see FIG. 3) electrically connected to the light emitting element ED. The pixel circuit PXC (see FIG. 3) may include a plurality of transistors TR1 and TR2 (see FIG. 3). A first power source voltage ELVDD and a second power source voltage ELVSS may be provided to each of the pixels PX.

The pixels PX may be arranged in a regular rule on the plane of the display panel DP. Each of the pixels PX may display one of primary colors or one of mixed colors. The primary colors may include red, green, and blue colors, and the mixed colors may include various colors such as yellow, cyan, magenta, and white colors. However, the inventive concept is not limited to the colors displayed by the pixels PX.

The signal controller TC receives image data RGB provided from the outside. The signal controller TC may convert the image data RGB to match an operation of the display panel DP and thereby to generate converted image data R'G'B' and output the converted image data R'G'B' to the data driver DDV.

Also, the signal controller TC may receive a control signal CS provided from the outside. The control signal CS may include a vertical synchronization signal, a horizontal synchronization signal, a main clock signal, a data enable signal, and the like.

The signal controller TC provides a first control signal CONT1 to the data driver DDV and provides a second control signal CONT2 to the scan driver GDV. The first control signal CONT1 may be a signal for controlling the data driver DDV, and the second control signal CONT2 may be a signal for controlling the scan driver GDV.

The data driver DDV may provide an electrical signal to the plurality of data lines DL1 to DLm in response to the first control signal CONT1 received from the signal controller TC. The data driver DDV may be realized as an independent integrated circuit and thus, may be electrically connected to one side of the display panel DP or directly mounted on the display panel DP. Also, the data driver DDV may be realized as either a single chip or a plurality of chips.

The scan driver GDV may provide an electrical signal to the plurality of scan lines SL1 to SLn in response to the second control signal CONT2 received from the signal controller TC. The scan driver GDV may be integrated with a predetermined area of the display panel DP. For example, the scan driver GDV may include a plurality of transistors formed through the same process as the pixel circuit PXC (see FIG. 3) of the pixels PX, for example, a low temperature polycrystalline silicon (LTPS) process or a low temperature polycrystalline oxide (LTPO) process. Also, the scan driver GDV according to another exemplary embodiment of the inventive concept may be realized as an independent integrated circuit chip and electrically connected to one side of the display panel DP.

While a gate turn-on voltage is applied to one scan line of the plurality of scan lines SL1 to SLn, a switching transistor of each of the pixels PX, which are arranged in one row and connected to the one scan line, may be turned on. Here, the data driver DDV provides data driving signals to the data lines DL1 to DLm. The data driving signals supplied to the data lines DL1 to DLm are applied to the corresponding pixels PX through the turned-on switching transistor. The data driving signals are analog voltages corresponding to gray level values of the image data RGB.

Figure 3:
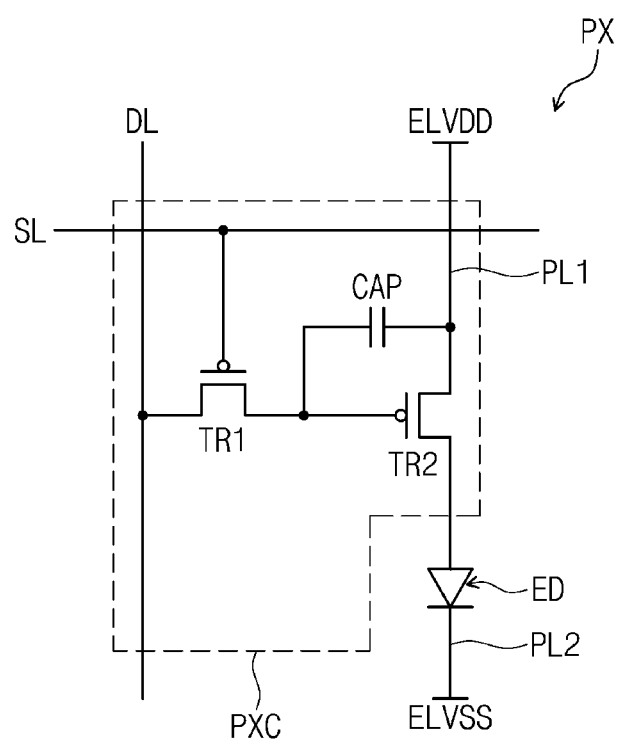
FIG. 3 is an equivalent circuit diagram of a pixel according to an exemplary embodiment of the inventive concept.

FIG. 3 is an equivalent circuit diagram of the pixel according to an exemplary embodiment of the inventive concept. FIG. 3 illustrates an equivalent circuit diagram of one pixel PX (hereinafter, referred to a pixel) of the plurality of pixels PX.

Referring to FIG. 3, the pixel PX may be electrically connected to a plurality of signal lines. In this exemplary embodiment, a scan line SL, a data line DL, a first power source line PL1, and a second power source line PL2 of the signal lines are illustrated as an example. However, this is merely an example. For example, the pixel PX according to the inventive concept may be additionally connected to various signal lines, but is not limited to a specific embodiment.

The pixel PX may include the light emitting element ED and the pixel circuit PXC. The pixel circuit PXC may include a first transistor TR1, a capacitor CAP, and a second transistor TR2. This is merely an example. That is, the number of transistors and the number of capacitors provided in the pixel circuit PXC are not limited to that shown in FIG. 3. For example, the pixel circuit PXC according to another exemplary embodiment of the inventive concept may include seven transistors and one capacitor.

The first transistor TR1 may be a switching transistor that controls turn-on/off of the pixel PX. The first transistor TR1 may transmit or block the data signal transmitted through the data line DL in response to the scan signal transmitted through the scan line SL.

The capacitor CAP is connected to the first transistor TR1 and the first power source line PL1. The capacitor CAP charges electrical charges by an amount corresponding to a difference between the data signal received from the first transistor TR1 and a first power source voltage ELVDD applied to the first power source line PL1.

The second transistor TR2 is connected to the first transistor TR1, the capacitor CAP, and the light emitting element ED. The second transistor TR2 controls driving current flowing through the light emitting element ED to correspond to a charge amount stored in the capacitor CAP. A turn-on time of the second transistor TR2 may be determined according to the amount of charge stored in the capacitor CAP.

Each of the first transistor TR1 and the second transistor TR2 may be an N-type transistor or a P-type transistor. Also, according to another exemplary embodiment of the inventive concept, one of the first transistor TR1 and the second transistor TR2 may be an N-type transistor, and the other may be a P-type transistor.

The light emitting element ED may be electrically connected to the second transistor TR2 and the second power source line PL2. The light emitting element ED may receive the second power source voltage ELVSS through the second power source line PL2.

The light emitting element ED emits light at a voltage corresponding to a difference between the signal transmitted through the second transistor TR2 and the second power source voltage ELVSS received through the second power source line PL2.

The light emitting element ED may be a micro light emitting diode element. The micro light emitting diode element may be an LED element having a length of several nanometers to several hundred micrometers. However, the length of the micro light emitting diode element is merely an example. For example, the length of the micro light emitting diode element is not limited to the above-described length range.

The light emitting element ED may emit a light having a specific wavelength band. For example, the light emitting element ED may emit red light, blue light, or green light.

The light emitting element ED may include an n-type semiconductor layer, a p-type semiconductor layer, and an active layer. The active layer may be disposed between the n-type semiconductor layer and the p-type semiconductor layer.

The n-type semiconductor layer may be provided by doping an n-type dopant into a semiconductor layer, and the p-type semiconductor layer may be provided by doping a p-type dopant into the semiconductor layer. The semiconductor layer may include a semiconductor material. For example, the semiconductor material may be GaN, AlN, AlGaN, InGaN, InN, InAlGaN, or AlInN, but is not limited thereto. The n-type dopant may silicon (Si), germanium (Ge), tin (Sn), selenium (Se), tellurium (Te), or a combination thereof, but is not limited thereto. The p-type dopant may be magnesium (Mg), zinc (Zn), calcium (Ca), strontium (Sr), barium (Ba), or a combination thereof, but is not limited thereto.

The active layer may have at least one of a single quantum well structure, a multi quantum well structure, a quantum wire structure, or a quantum dot structure. The active layer may be a region in which electrons injected through the n-type semiconductor layer and holes injected through the p-type semiconductor layer are recombined with each other. The active layer may be a layer that emits light having energy determined by the energy band inherent to the material. The active layer may be disposed at various positions according to the kinds of diodes used.

Although one light emitting element ED is connected between the second transistor TR2 and the second power source line PL2 in FIG. 3, a plurality of light emitting elements ED may be provided. The plurality of light emitting elements ED may be connected in parallel with each other.

Figure 4:
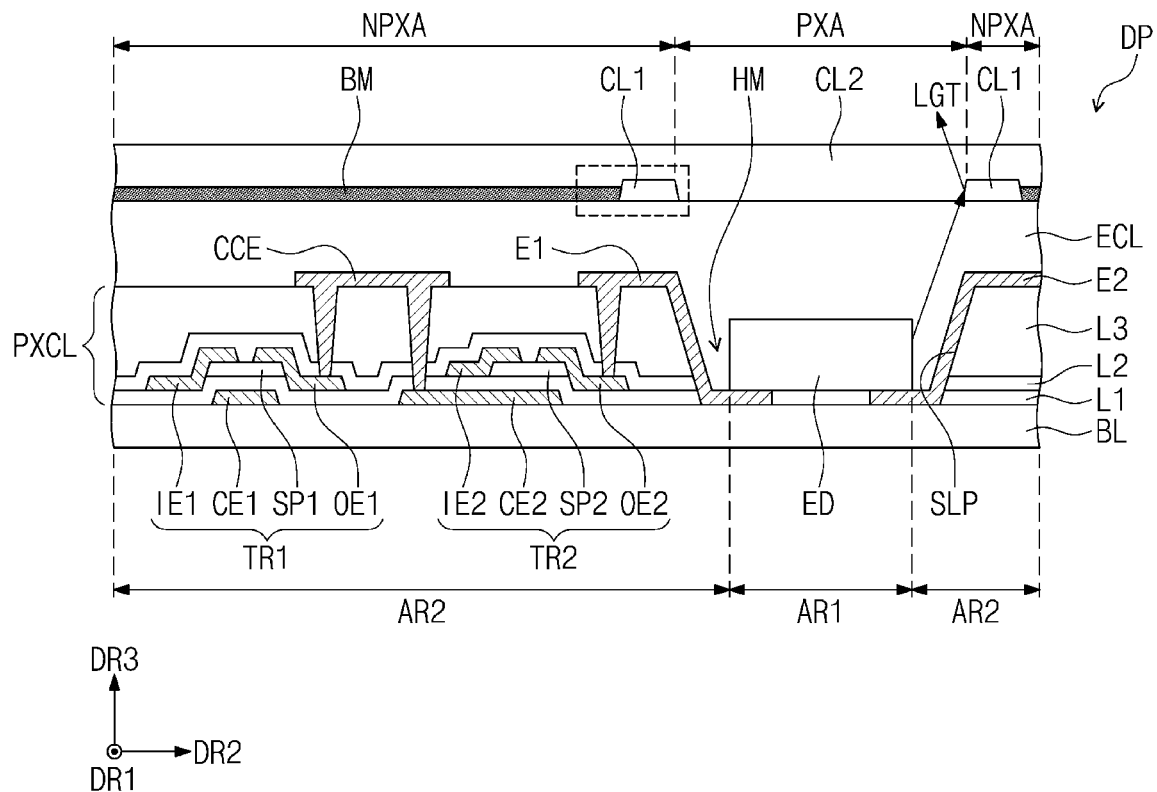
FIG. 4 is a cross-sectional view of a display panel according to an exemplary embodiment of the inventive concept.

FIG. 4 is a cross-sectional view of the display panel according to an exemplary embodiment of the inventive concept.

Referring to FIGS. 3 and 4, the display panel DP may include a base layer BL, a pixel circuit layer PXCL, a first electrode E1, a second electrode E2, a light emitting element ED, an encapsulation layer ECL, a first refraction layer CL1, a second refraction layer CL2, and a light blocking layer BM.

The base layer BL may include a flexible material. For example, the base layer BL may be a plastic substrate. The plastic substrate may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin. For example, the base layer BL may include a single-layered polyimide resin. However, the inventive concept is not limited thereto. For example, the base layer BL may have a laminated structure including a plurality of insulation layers. According to another exemplary embodiment of the inventive concept, the base layer BL may include a rigid material. For example, the base layer BL may be a glass substrate.

The base layer BL may include a first area AR1 and a second area AR2 adjacent to the first area AR1. The first area AR1 and the second area AR2 may be areas that are divided when viewed on the plane. The first area AR1 and the second area AR2 will be described below in detail.

The pixel circuit layer PXCL is disposed on the base layer BL. The pixel circuit layer PXCL may include a pixel circuit PXC and a plurality of insulation layers L1, L2, and L3. In FIG. 4, a first transistor TR1 and a second transistor TR2 of the pixel circuit PXC are illustrated.

The first transistor TR1 may include a first control electrode CE1, a first input electrode IE1, a first output electrode OE1, and a first semiconductor pattern SP1. The second transistor TR2 may include a second control electrode CE2, a second input electrode IE2, a second output electrode OE2, and a second semiconductor pattern SP2.

The first control electrode CE1 and the second control electrode CE2 may be disposed on the base layer BL. Each of the first control electrode CE1 and the second control electrode CE2 may include a metal material.

The first insulation layer L1 may be disposed on the base layer BL to cover the first control electrode CE1 and the second control electrode CE2. That is, the first control electrode CE1 and the second control electrode CE2 may be disposed between the first insulation layer L1 and the base layer BL.

A first semiconductor pattern SP1 and a second semiconductor pattern SP2 may be disposed on the first insulation layer L1. The first semiconductor pattern SP1 may be disposed to be spaced apart from the first control electrode CE1 on the cross-section, and the second semiconductor pattern SP2 may be disposed to be spaced apart from the second control electrode CE2 on the cross-section.

Each of the first and second semiconductor patterns SP1 and SP2 may include a semiconductor material. For example, the first semiconductor pattern SP1 and the second semiconductor pattern SP2 may include the same semiconductor material. Alternatively, the first semiconductor pattern SP1 and the second semiconductor pattern SP2 may include semiconductor materials different from each other. For example, the semiconductor material may include at least one of amorphous silicon, polycrystalline silicon, single crystal silicon, an oxide semiconductor, and a compound semiconductor.

The first input electrode IE1 and the first output electrode OE1 may be disposed on the first semiconductor pattern SP1, and second input electrode IE2 and the second output electrode OE2 may be disposed on the second semiconductor pattern SP2.

The second insulation layer L2 may be disposed on the first insulation layer L1 to cover the first and second semiconductor patterns SP1 and SP2, the first and second input electrodes IE1 and IE2, and the first and second output electrodes OE1 and OE2. The first and second semiconductor patterns SP1 and SP2, the first and second input electrodes IE1 and IE2, and the first and second output electrodes OE1 and OE2 may be disposed between the first insulation layer L1 and the second insulation layer L2.

The third insulation layer L3 may be disposed on the second insulation layer L2. For example, each of the first insulation layer L1 and the second insulation layer L2 may include an inorganic material, and the third insulation layer L3 may include an organic material. The third insulation layer L3 may provide a planarization surface.

A connection electrode CCE may be disposed on the third insulation layer L3. The connection electrode CCE may connect the first output electrode OE1 to the second control electrode CE2. A through-hole may be defined in each of the second and third insulation layers L2 and L3. The first output electrode OE1 may be exposed through the through-holes. The connection electrode CCE may be electrically connected to the exposed first output electrode OE1. A through-hole may be defined in each of the first to third insulation layers L1, L2, and L3. The second control electrode CE2 may be exposed through the through-holes. The connection electrode CCE may be electrically connected to the exposed second control electrode CE2.

The first electrode E1 may be disposed on the third insulation layer L3. A through-hole may be defined in each of the second and third insulation layers L2 and L3. The second control electrode CE2 may be exposed through the through-holes. The first electrode E1 may be electrically connected to the second output electrode OE2.

The second electrode E2 may be disposed on the third insulation layer L3. Although not shown, the second electrode E2 may be electrically connected to the second power source line PL2 (see FIG. 3). That is, the second power source voltage ELVSS(see FIG. 3) may be provided to the second electrode E2.

The second electrode E2 may be spaced apart from the first electrode E1 and disposed on the same layer as the first electrode E1. For example, a groove HM may be defined in the pixel circuit layer PXCL. The groove HM may be defined by an inclined part SLP including ends of the first to third insulation layers L1, L2, and L3.

The first electrode E1 may be disposed on the third insulation layer L3, the inclined part SLP, and the base layer BL, and the second electrode E2 may be disposed on the third insulation layer L3, the inclined part SLP, and the base layer BL.

The connection electrode CCE, the first electrode E1, and the second electrode E2 may include the same conductive material. For example, each of the connection electrode CCE, the first electrode E1, and the second electrode E2 may include a reflective material. Each of the connection electrode CCE, the first electrode E1, and the second electrode E2 may have a single layer structure or a multilayered structure. For example, each of the connection electrode CCE, the first electrode E1, and the second electrode E2 may have a structure in which indium tin oxide (ITO), silver (Ag), and indium tin oxide (ITO) are sequentially laminated. However, the inventive concept is not limited thereto. For example, each of the connection electrode CCE, the first electrode E1, and the second electrode E2 may include indium zinc oxide (IZO), indium tin oxide (ITO), indium gallium oxide (IGO), indium zinc gallium oxide (IGZO), and a mixture/compound thereof or may include molybdenum, silver, titanium, copper, aluminum, or an alloy thereof.

The light emitting element ED may be disposed on the first electrode E1 and the second electrode E2 and electrically connected to the first electrode E1 and the second electrode E2.

The light emitting element ED may be transferred onto the first electrode E1 and the second electrode E2. For example, the light emitting element ED may be provided in plurality. Here, the plurality of light emitting elements ED may be transferred at the same time, or each of the plurality of light emitting elements ED may be separately transferred.

A method for transferring the light emitting element ED onto the first electrode E1 and the second electrode E2 may include a direct transfer method and a printing transfer method. The direct transfer method may be a method for directly transferring the light emitting element ED to the first electrode E1 and the second electrode E2. The printing transfer method may be a method for transferring the light emitting element ED to the first electrode E1 and the second electrode E2 by using an electrostatic head, a flat stamp, or a roll stamp. According to an exemplary embodiment of the inventive concept, only the first electrode E1, the second electrode E2, and the base layer BL may be disposed below the area on which the light emitting element ED is disposed. The constituents of the pixel circuit PXC, for example, the first transistor TR1 and the second transistor TR2 may not be disposed below the light emitting element ED.

While the light emitting element ED is transferred, a pressure may be applied to the area on which the light emitting element ED is disposed. According to an exemplary embodiment of the inventive concept, since the pixel circuit PXC is not disposed below the light emitting element ED, the pixel circuit PXC may be prevented from being damaged by the pressure. In addition, since the light emitting element ED is disposed on the same layer as the pixel circuit PXC, the display panel DP may be reduced in thickness, thereby improving flexibility of the display panel DP.

The first area AR1 of the base layer BL may be an area overlapping the light emitting element ED when viewed on the plane. The second area AR2 may be an area overlapping a peripheral area of the area on which the light emitting element ED is disposed when viewed on the plane. For example, when viewed on the plane, the second area AR2 may be defined as an area that does not overlap the light emitting element ED. That is, an emission area PXA from which light is emitted from the display panel DP may correspond to the first area AR1, and the second area AR2 may correspond to a peripheral area adjacent to the emission area PXA, for example, a non-emission area NPXA.

The encapsulation layer ECL may cover the pixel circuit layer PXCL, the connection electrode CCE, the first electrode E1, the second electrode E2, and the light emitting element ED. The encapsulation layer ECL may protect the pixel circuit layer PXCL, the connection electrode CCE, the first electrode E1, the second electrode E2, and the light emitting element ED against foreign substances, such as moisture/oxygen or dust particles. The encapsulation layer ECL may be a laminated structure. For example, the encapsulation layer ECL may include at least one organic encapsulation layer and at least one inorganic encapsulation layer, which are alternately laminated.

According to another exemplary embodiment of the inventive concept, the encapsulation layer ECL may include only the organic encapsulation layer. In this case, the encapsulation layer ECL may have a relatively small thickness when compared to the case in which the inorganic encapsulation layer is provided. Also, since the encapsulation layer ECL does not include the inorganic encapsulation layer that is relatively rigid when compared to the organic encapsulation layer, the display panel DP may have improved flexibility.

The first refraction layer CL1 may be disposed on the encapsulation layer ECL. The first refraction layer CL1 may have a first refractive index. The first refraction layer CL1 may be disposed to surround a surrounding of the light emitting element ED on the plane. The first refraction layer CL1 may be a layer that is patterned in a predetermined shape. Thus, the first refraction layer CL1 may be called a first pattern part.

The light blocking layer BM may be disposed on the encapsulation layer ECL. The light blocking layer BM may have a color that absorbs light. For example, the light blocking layer BM may a black or dark gray layer. The light blocking layer BM may overlap the pixel circuit PXC on the plane. For example, the light blocking layer BM may overlap the first transistor TR1 and the second transistor TR2. Also, the light blocking layer BM may overlap remaining areas except for the first area AR1. For example, the light blocking layer BM may overlap the second area AR2.

The light blocking layer BM may absorb external light incident into the pixel circuit PXC. That is, the light blocking layer BM may be provided to prevent the external light from being reflected by the pixel circuit PXC. The light blocking layer BM may prevent the external light from being reflected to improve display quality.

According to an exemplary embodiment of the inventive concept, the light blocking layer BM and the first refraction layer CL1 may be disposed on the same layer, for example, the encapsulation layer ECL. Also, the light blocking layer BM and the first refraction layer CL1 may be disposed adjacent to each other and may not overlap each other on the plane.

The second refraction layer CL2 may cover the first refraction layer CL1 and the light blocking layer BM and be disposed on the first refraction layer CL1, the light blocking layer BM, and the encapsulation layer ECL. Thus, the second refraction layer CL2 may overlap the first area AR1 and the second area AR2 when viewed on the plane.

The first refraction layer CL1 may have a first refractive index, and the second refraction layer CL2 may have a second refractive index greater than the first refractive index. For example, when the first refractive index is about 1.5, the second refractive index may be about 1.65. However, this is merely an example. For example, the values of the first refractive index and the second refractive index are not limited to the above-described values.

The first refraction layer CL1 may include a low-refractive index material, and the second refraction layer CL2 may include a high-refractive index material.

According to an exemplary embodiment of the inventive concept, the first refraction layer CL1 may include a base material and hollow particles that are mixed with the base material. For example, the base material may include acrylic or siloxane. The hollow particles may be mixed with the base material to reduce the refractive index. The hollow particles may be particles surrounded by a porous or non-porous shell, and each of the hollow particles may have a hollow center. Also, the first refraction layer CL1 may include a material that is capable of being patterned.

According to an exemplary embodiment of the inventive concept, the second refraction layer CL2 may include a material having a refractive index greater than that of the first refraction layer CL1. For example, the second refraction layer CL2 may include a base material and a high-refractive index material that is capable of improving the refractive index. For example, the base material may include acrylic or siloxane. For example, the high-refractive index material may include at least one of zirconium oxide ($ZrO_X$), titanium dioxide ($TiO_2$), calcium carbonate ($CaCO_3$), silicon dioxide ($SiO_2$), zinc oxide (ZnO), magnesium hydroxide ($Mg(OH)_2$), and lithopone ($BaSO_{2+}ZnS$). According to another exemplary embodiment of the inventive concept, the first refraction layer CL1 may not include the hollow particles, and the second refraction layer CL2 may not include the high-refractive index material. In this case, the first refraction layer CL1 may be made of a material selected from materials having a refractive index less than that of the second refraction layer CL2, and the second refraction layer CL2 may be made of a material selected from materials having a refractive index greater than that of the first refraction layer CL1.

Light LGT emitted from the light emitting element ED may be incident into the first refraction layer CL1. Since the refractive indexes of the first refraction layer CL1 and the second refraction layer CL2 are different from each other, the light LGT may be totally reflected or refracted by a boundary between the first refraction layer CL1 and the second refraction layer CL2 so as to change its optical path. The light LGT that is changed in optical path may be emitted to the emission area PXA. Thus, the display panel DP may be improved in emission efficiency.

Figure 5:
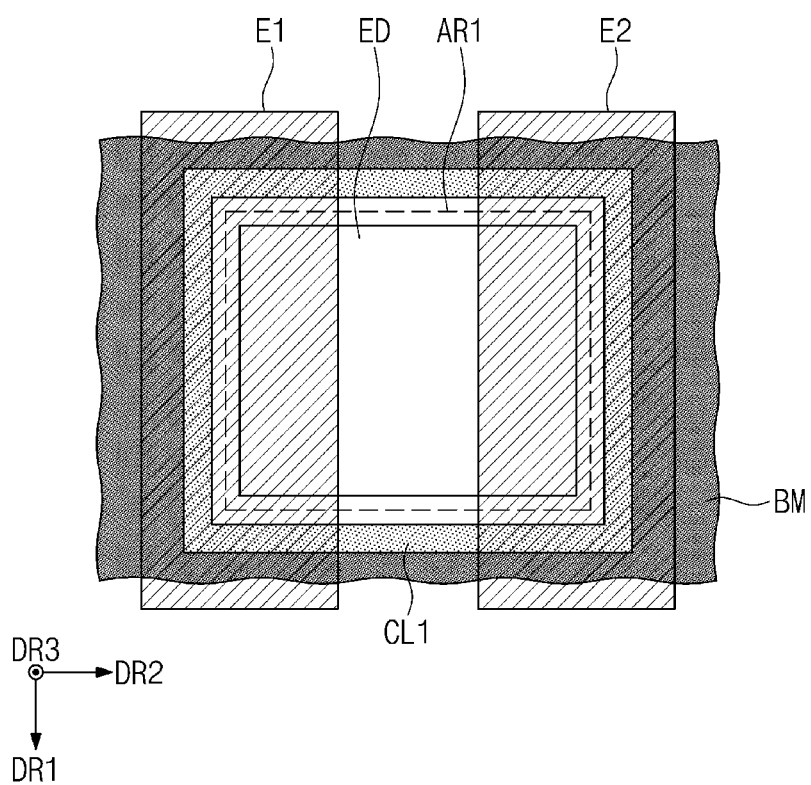
FIG. 5 is an enlarged plan view illustrating a portion of constituents of the display device according to an exemplary embodiment of the inventive concept.

FIG. 5 is an enlarged plan view illustrating a portion of constituents of the display device according to an exemplary embodiment of the inventive concept.

Referring to FIG. 5, the light emitting element ED is disposed on the area overlapping the first area AR1, and the first refraction layer CL1 and the light blocking layer BM are disposed on the area overlapping the second area AR2 (see FIG. 4). The first refraction layer CL1 may have a shape that surrounds the surrounding of the light emitting element ED.

When viewed on the plane, the first refraction layer CL1 may have a shape that surrounds the first area AR1. Although the first refraction layer CL1 has a rectangular ring shape in FIG. 5, the inventive concept is not limited thereto. The first refraction layer CL1 may be deformed in shape to correspond to that of the first area AR1, deformed in shape to correspond to that of the emission area PXA (see FIG. 4), or deformed in shape to correspond to that of the light emitting element ED. For example, when the light emitting element ED has a circular shape on the plane, the first refraction layer CL1 may have a circular ring shape.

Light, which is incident into the first refraction layer CL1, of the light emitted from the light emitting element ED may be totally reflected or refracted to emit light through the area overlapping the light emitting element ED. Thus, emission efficiency of the display device DD (see FIG. 1) may be improved.

Figure 6A:
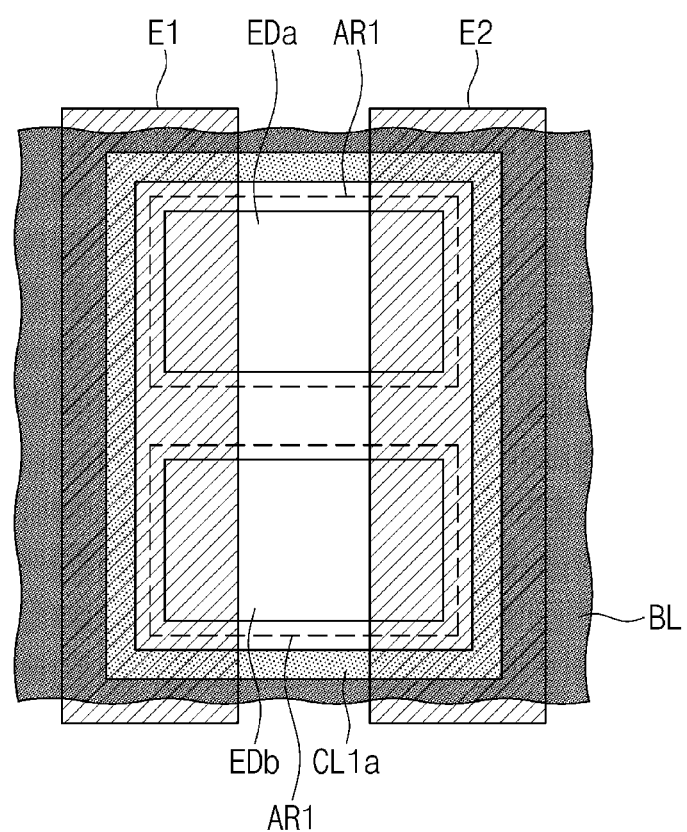
FIG. 6A is an enlarged plan view illustrating a portion of the constituents of the display device according to an exemplary embodiment of the inventive concept.
Figure 6A:
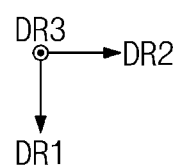

FIG. 6A is an enlarged plan view illustrating a portion of the constituents of the display device according to an exemplary embodiment of the inventive concept.

Referring to FIG. 6A, one pixel PX (see FIG. 3) may include a plurality of light emitting elements EDa and EDb. The light emitting elements EDa and EDb may include a first light emitting element EDa and a second light emitting element EDb. The first light emitting element EDa and the second light emitting element EDb may be connected in parallel to each other. The first light emitting element EDa and the second light emitting element EDb may be electrically connected to the first electrode E1 and the second electrode E2, respectively. The first light emitting element EDa and the second light emitting element EDb may be disposed to overlap the first area AR1.

The first refraction layer CL1a may have a ring shape on the plane to surround the first and second light emitting elements EDa and EDb. The first and second light emitting elements EDa and EDb may be light emitting elements provided in one pixel. Thus, an area between the first light emitting element EDa and the second light emitting element EDb may correspond to the emission area PXA of FIG. 4. Thus, a first refraction layer CL1a may not be disposed between the first light emitting element EDa and the second light emitting element EDb.

Figure 6B:
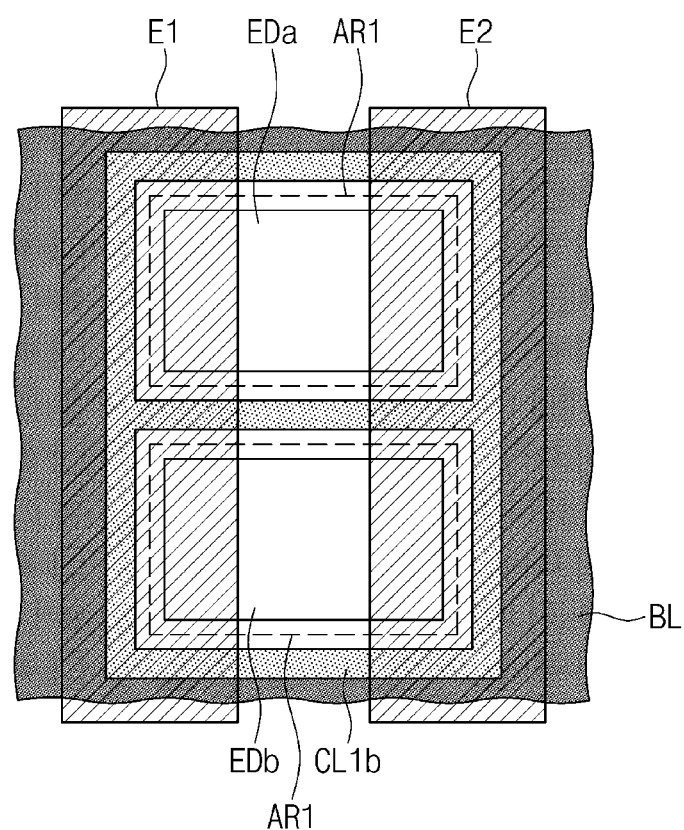
FIG. 6B is an enlarged plan view illustrating a portion of the constituents of the display device according to an exemplary embodiment of the inventive concept.

FIG. 6B is an enlarged plan view illustrating a portion of the constituents of the display device according to an exemplary embodiment of the inventive concept. In the description of FIG. 6B, contents different from those of FIG. 6A will be described.

Referring to FIG. 6B, a first refraction layer CL1b may surround each of the first and second light emitting elements EDa and EDb on the plane. Thus, the first refraction layer CL1b may be disposed on an area between the first light emitting element EDa and the second light emitting element EDb.

In FIGS. 5, 6A and 6B, the first refraction layers CL1, CL1a, and CL1b are shaded to clearly distinguish the first refraction layers CL1, CL1a, and CL1b from each other.

Figure 7A:
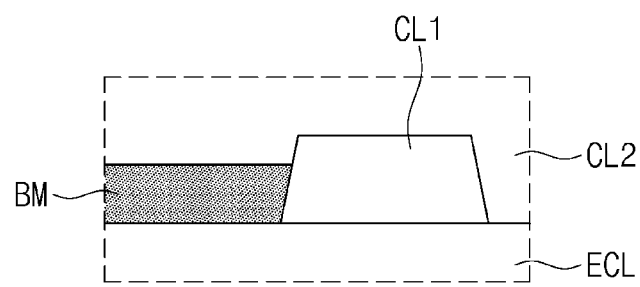
FIG. 7A is an enlarged cross-sectional view illustrating a portion of the display device according to an exemplary embodiment of the inventive concept.
Figure 7A:
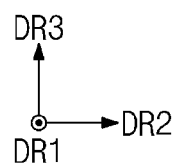

FIG. 7A is an enlarged cross-sectional view illustrating a portion of the display device according to an exemplary embodiment of the inventive concept. In FIG. 7A, the encapsulation layer ECL, the first refraction layer CL1, the second refraction layer CL2, and the light blocking layer BM are illustrated.

Referring to FIG. 7A, the first refraction layer CL1 may have a trapezoidal shape in cross-section. Thus, a boundary surface between the first refraction layer CL1 and the second refraction layer CL2 may have a shape that is inclined with respect to the outermost surface of the encapsulation layer ECL. Light incident into the boundary surface from the second refraction layer CL2 toward the first refraction layer CL1 may have an incident angle greater than that when the boundary surface is perpendicular to the encapsulation layer ECL. Thus, the probability that the light incident into the boundary surface is totally reflected may increase. As a result, the probability that the light incident into the first refraction layer CL1 is totally reflected or refracted to be emitted to the emission area PXA (see FIG. 4) may increase. That is, the display device DD (see FIG. 1) may be improved in light extraction efficiency.

Figure 7B:
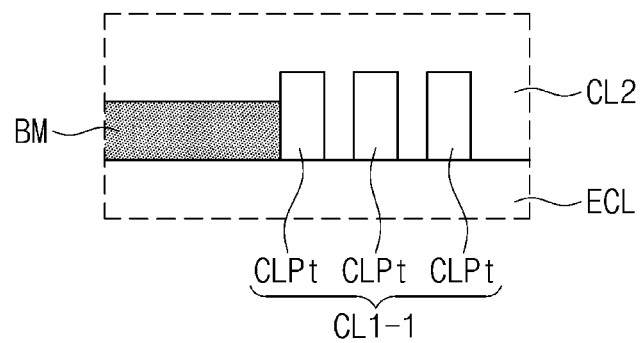
FIG. 7B is an enlarged cross-sectional view illustrating a portion of the display device according to an exemplary embodiment of the inventive concept.
Figure 7B:
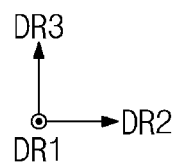

FIG. 7B is an enlarged cross-sectional view illustrating a portion of the display device according to an exemplary embodiment of the inventive concept.

Referring to FIG. 7B, a first refraction layer CL1-1 may include a plurality of cover patterns CLPt. The cover patterns CLPt may be disposed to be spaced apart from each other. The first refraction layer CL1-1 includes three cover patterns CLPt, but the inventive concept is not limited thereto. The number of cover patterns CLPt may be two, three, or more than three.

Each of the cover patterns CLPt may have a rectangular shape on the cross-section. However, the inventive concept is not limited thereto. For example, each of the cover patterns CLPt may have a trapezoidal shape in cross-section, and the outermost surface of the each of the cover patterns CLPt may have a curved shape.

Figure 7C:
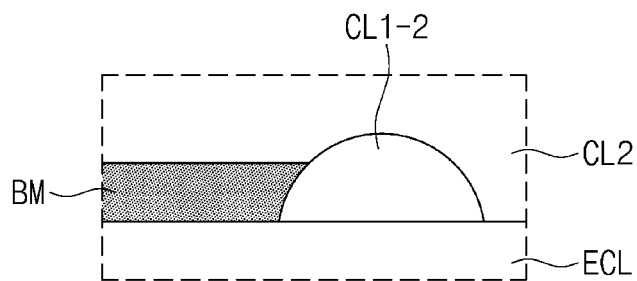
FIG. 7C is an enlarged cross-sectional view illustrating a portion of the display device according to an exemplary embodiment of the inventive concept.
Figure 7C:
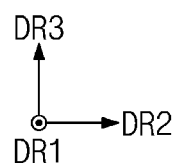

FIG. 7C is an enlarged cross-sectional view illustrating a portion of the display device according to an exemplary embodiment of the inventive concept.

Referring to FIG. 7C, the outermost surface of a first refraction layer CL1-2 may have a curved shape. For example, the first refraction layer CL1-2 may have a semicircular shape that is convex in the cross-section. Thus, a boundary surface between the first refraction layer CL1 and the second refraction layer CL2 may have an inclined shape. Light incident into the boundary surface may have an incident angle greater than that when the boundary surface is perpendicular to the encapsulation layer ECL. Thus, the probability that the light incident into the boundary surface is totally reflected may increase. As a result, the probability that the light incident into the first refraction layer CL1-2 is totally reflected or refracted to be emitted to the emission area PXA (see FIG. 4) may increase. That is, light extraction efficiency of the display device DD (see FIG. 1) may be improved.

Figure 7D:
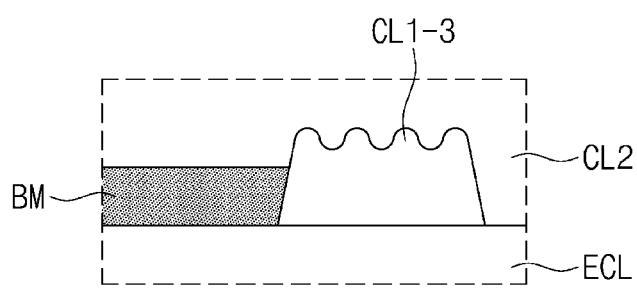
FIG. 7D is an enlarged cross-sectional view illustrating a portion of the display device according to an exemplary embodiment of the inventive concept.
Figure 7D:
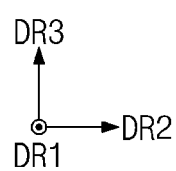

FIG. 7D is an enlarged cross-sectional view illustrating a portion of the display device according to an exemplary embodiment of the inventive concept.

Referring to FIG. 7D, the outermost surface of a first refraction layer CL1-3 contacting the second refraction layer CL2 has a curved shape. For example, the first refraction layer CL1-3 may have a shape in which a convex area and a concave area are alternately repeated. Since the first refraction layer CL1-3 has the curved shape, although light incident from the outside is reflected by a metal disposed below the first refraction layer CL1-3, for example, the first electrode E1 (see FIG. 4), the reflected light may be scattered on a top surface of the first refraction layer CL1-3. Thus, the phenomenon in which the light incident from the outside is reflected to be emitted again to the outside of the display panel DP (see FIG. 4) may be prevented.

Figure 8:
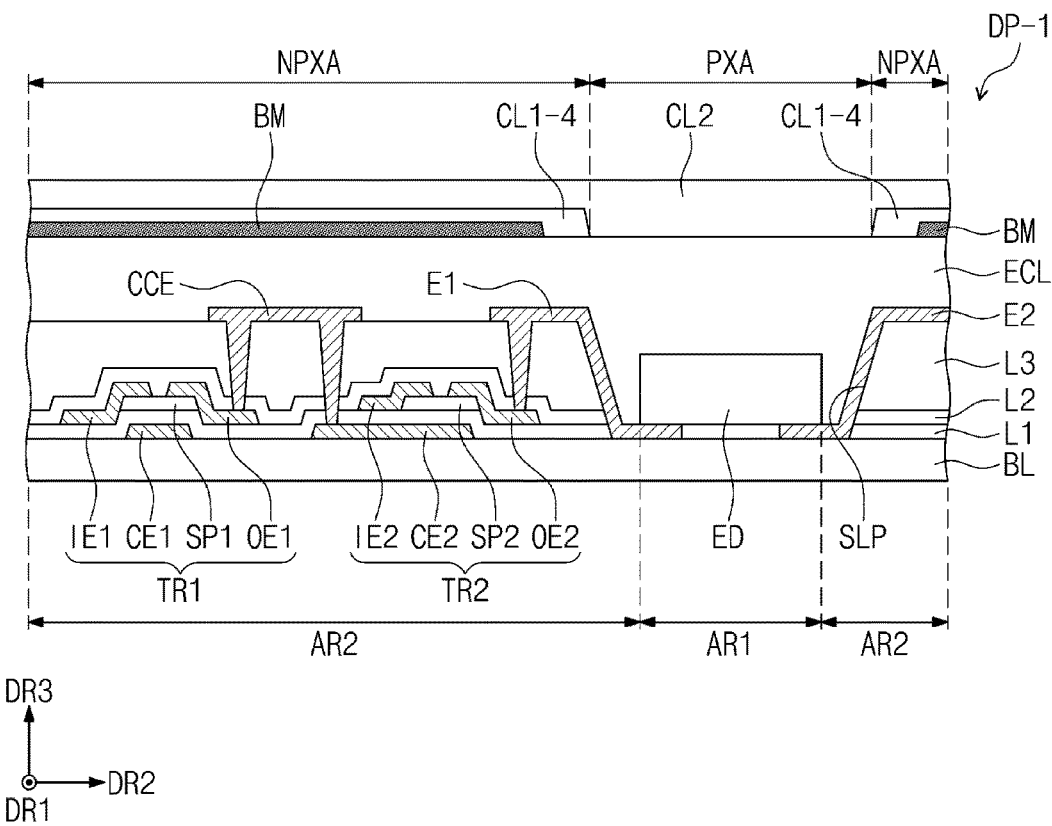
FIG. 8 is a cross-sectional view of a display panel according to an exemplary embodiment of the inventive concept.

FIG. 8 is a cross-sectional view of a display panel according to an exemplary embodiment of the inventive concept. In description of FIG. 8, the same reference numeral may be given to components that are the same as the components of FIG. 4, and their detailed descriptions will be omitted.

Referring to FIG. 8, a light blocking layer BM of a display panel DP-1 may be disposed on the encapsulation layer ECL. The light blocking layer BM may be disposed on the second area AR2 to cover the first transistor TR1 and the second transistor TR2.

A first refraction layer CL1-4 may be disposed on the light blocking layer BM and the encapsulation layer ECL. The first refraction layer CL1-4 may be disposed on the second area AR2 to cover the light blocking layer BM.

The second refraction layer CL2 may be disposed on the first refraction layer CL1-4 to cover the first refraction layer CL1-4. The second refraction layer CL2 may provide a planarization surface.

The first refraction layer CL1-4 may include a material having a first refractive index, and the second refraction layer CL2 may include a material having a second refractive index greater than the first refractive index.

Figure 9:
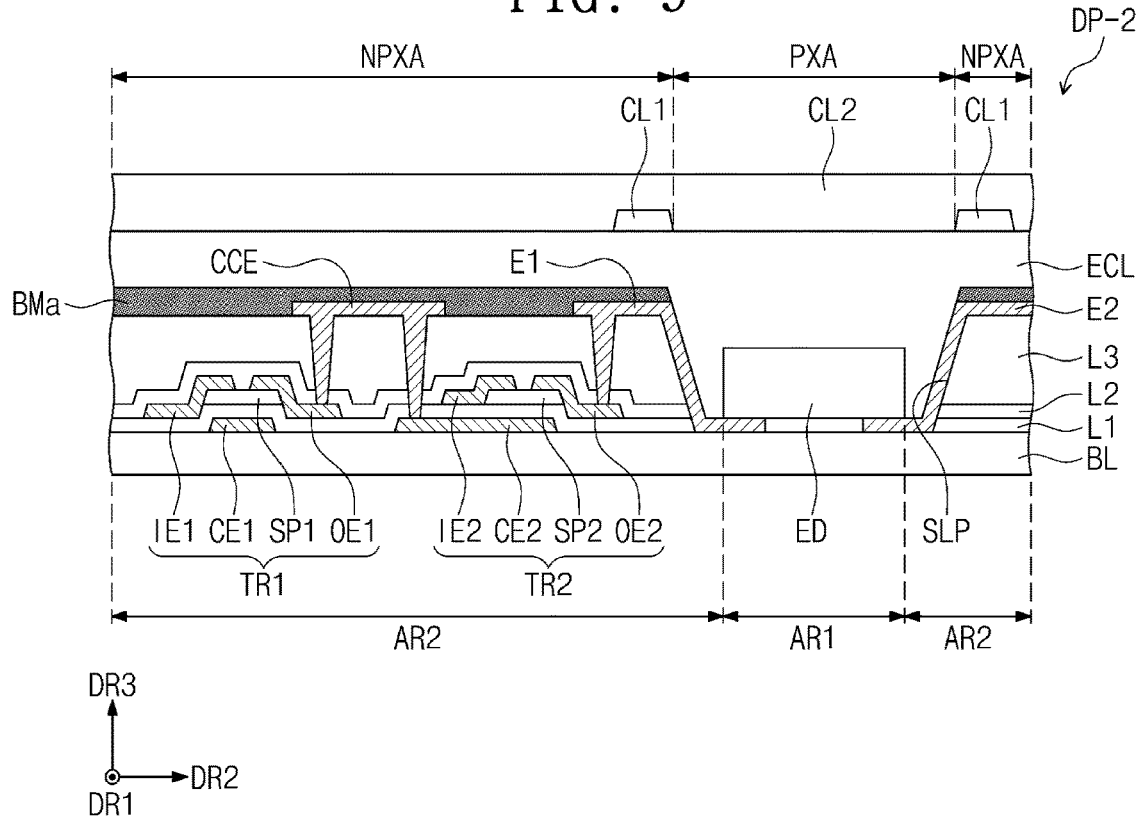
FIG. 9 is a cross-sectional view of a display panel according to an exemplary embodiment of the inventive concept.

FIG. 9 is a cross-sectional view of a display panel according to an exemplary embodiment of the inventive concept. In description of FIG. 9, the same reference numeral may be given to components that are the same as the components of FIG. 4, and their detailed descriptions will be omitted.

Referring to FIG. 9, a light blocking layer BMa of a display panel DP-2 may be disposed below the encapsulation layer ECL. Also, the light blocking layer BMa may be disposed between the third insulation layer L3 and the encapsulation layer ECL. The light blocking layer BMa may directly cover the connection electrode CCE, a portion of the first electrode E1, and a portion of the second electrode E2. The term "directly cover" may mean that the light blocking layer BMa and the connection electrode CCE are directly disposed with respect to each other without providing another constituent between the light blocking layer BMa and the connection electrode CCE.

The light blocking layer BMa may absorb light incident from the outside to prevent the light from being reflected by the connection electrode CCE, the first electrode E1, and the second electrode E2.

Figure 10:
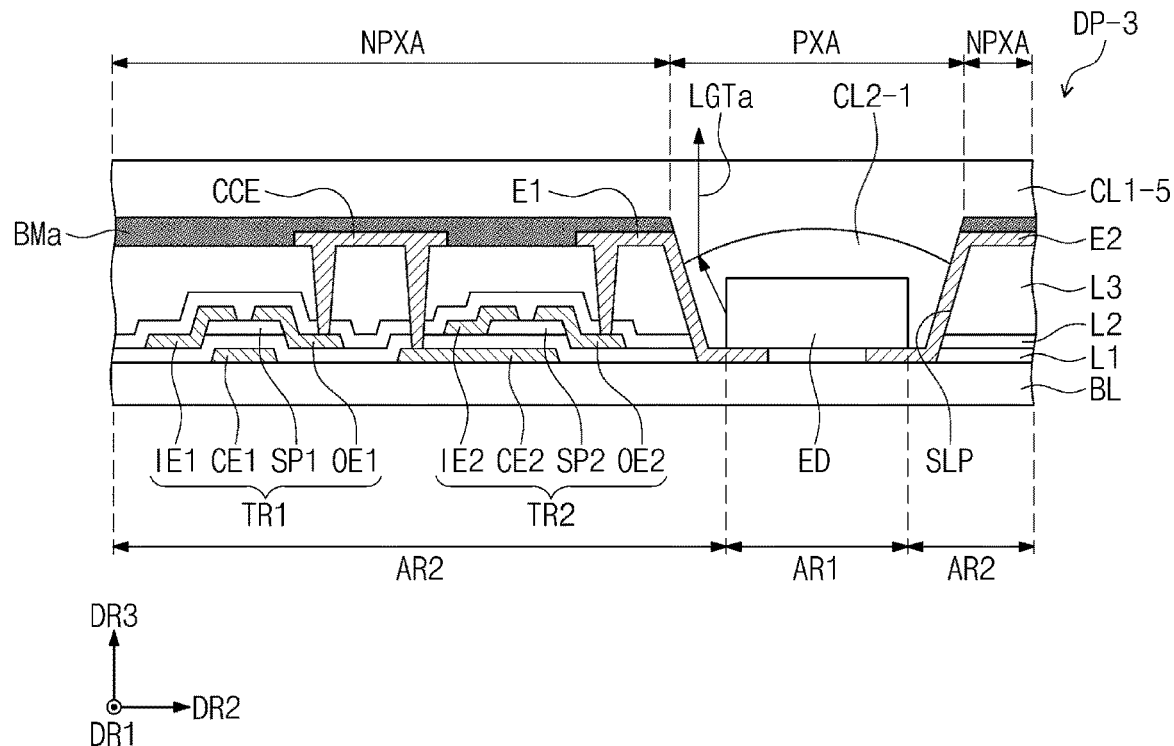
FIG. 10 is a cross-sectional view of a display panel according to an exemplary embodiment of the inventive concept.

FIG. 10 is a cross-sectional view of a display panel according to an exemplary embodiment of the inventive concept. In description of FIG. 10, the same reference numeral may be given to components that are the same as the components of FIG. 4, and their detailed descriptions will be omitted.

Referring to FIG. 10, a second refraction layer CL2-1 of a display panel DP-3 may cover the light emitting element ED. Thus, when viewed on the plane, the second refraction layer CL2-1 may overlap the first area AR1.

The second refraction layer CL2-1 may include a material having a second refractive index. The material having the second refractive index may be a material having a refractive index greater than a first refractive index of a first refraction layer CL1-5.

The second refraction layer CL2-1 may include a base material such as acrylic or siloxane and a high-refractive index material mixed with the base material. For example, the high-refractive index material may include at least one of zirconium oxide ($ZrO_X$), titanium dioxide ($TiO_2$), calcium carbonate ($CaCO_3$), silicon dioxide ($SiO_2$), zinc oxide (ZnO), magnesium hydroxide ($Mg(OH)_2$), and lithopone ($BaSO_{2+}ZnS$). However, the inventive concept is not limited thereto. For example, the high-refractive index material is not limited to a specific material as long as the second refraction layer CL2-1 includes a material having a refractive index greater than that of the first refraction layer CL1-5.

The second refraction layer CL2-1 may be provided to the light emitting element ED through an inkjet process, but the process of forming the second refraction layer CL2-1 is not limited thereto.

The second refraction layer CL2-1 may have a lens shape. That is, the second refraction layer CL2-1 may have a curved outermost surface. The second refraction layer CL2-1 may be called a pattern layer.

The light blocking layer BMa may be disposed on the third insulation layer L3. The light blocking layer BMa may cover the connection electrode CCE, a portion of the first electrode E1, and a portion of the second electrode E2.

The first refraction layer CL1-5 may be disposed on the second refraction layer CL2-1 and the light blocking layer BMa. The first refraction layer CL1-5 may provide a planarization surface at the outermost surface. The first refraction layer CL1-5 may include a material having a first refractive index. The first refractive index may be smaller than the second refractive index. For example, the first refraction layer CL1-5 may include a base material and hollow particles that are mixed with the base material.

Light LGTa emitted from the light emitting element ED may be refracted by a boundary surface between the first refraction layer CL1-5 and the second refraction layer CL2-1. Since the first refraction layer CL1-5 has the refractive index less than that of the second refraction layer CL2-1, collection of the light LGTa may increase. Thus, light extraction efficiency of the display panel DP-3 may be improved.

Figure 11:
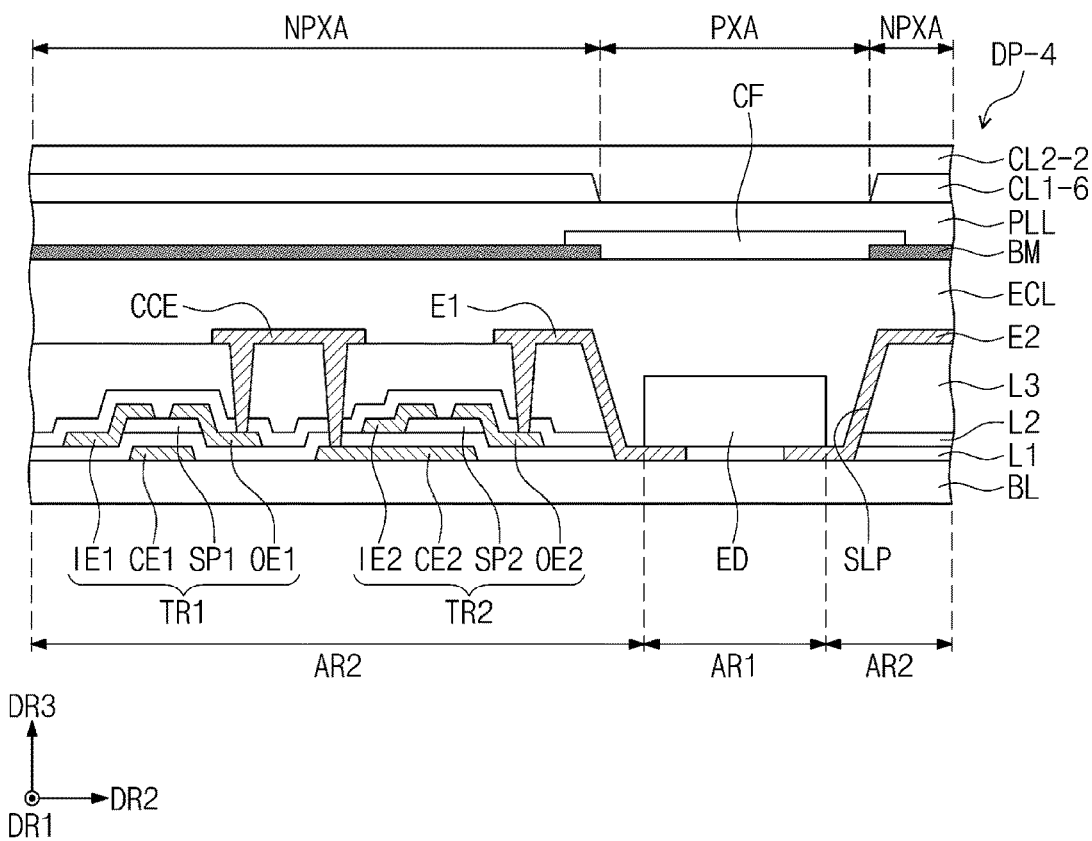
FIG. 11 is a cross-sectional view of a display panel according to an exemplary embodiment of the inventive concept.

FIG. 11 is a cross-sectional view of a display panel according to an exemplary embodiment of the inventive concept. In description of FIG. 11, the same reference numeral may be given to components that are the same as the components of FIG. 4, and their detailed descriptions will be omitted.

Referring to FIG. 11, a display panel DP-4 may further include a color filter layer CF. The color filter layer CF may be provided to reduce reflection of external light. The color filter layer CF may reduce the reflection of the external light to improve display quality. According to an exemplary embodiment of the inventive concept, the display panel DP-4 may include the color filter layer CF and may not include a polarizing member. Thus, the reflection of the external light may be reduced while minimizing reduction of luminance to improve the display quality.

The light blocking layer BM and the color filter layer CF may be disposed on the encapsulation layer ECL. A planarization layer PLL may be disposed on the encapsulation layer ECL. The planarization layer PLL may cover the light blocking layer BM and the color filter layer CF and provide a planarization surface.

The light blocking layer BM may overlap the second area AR2 on the plane and be disposed between the encapsulation layer ECL and the planarization layer PLL. The color filter layer CF may overlap the first area AR1 on the plane and be disposed between the encapsulation layer ECL and the planarization layer PLL.

The first refraction layer CL1-6 and the second refraction layer CL2-2 may be disposed on the planarization layer PLL. The first refraction layer CL1-6 may include a material having a first refractive index, and the second refraction layer CL2-2 may include a material having a second refractive index greater than that of the first refraction layer CL1-6.

The first refraction layer CL1-6 may overlap the second area AR2 on the plane, and the second refraction layer CL2-2 may overlap the first area AR1 and the second area AR2 on the plane. The second refraction layer CL2-2 may provide a planarization surface at the outermost surface of the display panel DP-4.

Figure 12:
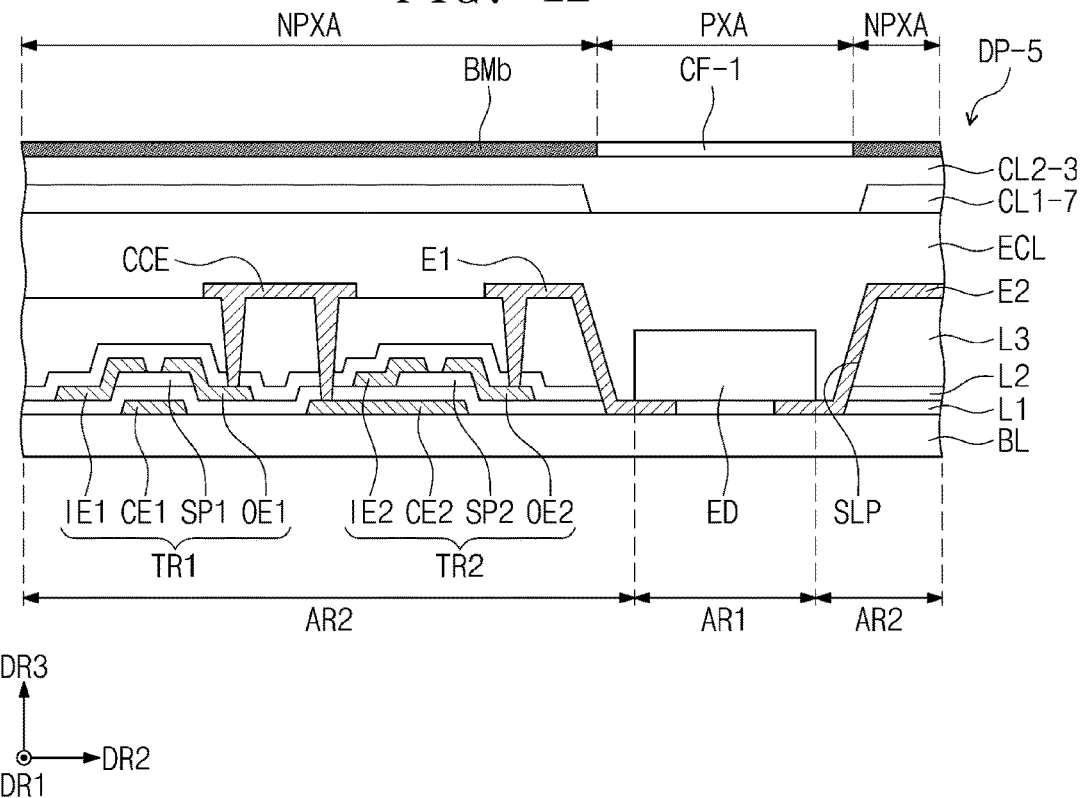
FIG. 12 is a cross-sectional view of a display panel according to an exemplary embodiment of the inventive concept.

FIG. 12 is a cross-sectional view of a display panel according to an exemplary embodiment of the inventive concept. In description of FIG. 12, the same reference numeral may be given to components that are the same as the components of FIG. 4, and their detailed descriptions will be omitted.

Referring to FIG. 12, a first refraction layer CL1-7 may be disposed on the encapsulation layer ECL, and the first refraction layer CL1-7 may not overlap the first area AR1.

A second refraction layer CL2-3 may cover the first refraction layer CL1-7. The first refraction layer CL1-7 may have a refractive index less than that of the second refraction layer CL2-3. Light incident into the first refraction layer CL1-7 may be totally reflected by a boundary between the first refraction layer CL1-7 and the second refraction layer CL2-3 and then be emitted to the emission area PXA.

A display panel DP-5 may further include a color filter layer CF-1. A light blocking layer BMb and the color filter layer CF-1 may be disposed on the second refraction layer CL2-3. The light blocking layer BMb may overlap the first and second transistors TR1 and TR2, and the color filter layer CF-1 may overlap the light emitting element ED on the plane.

Figure 13:
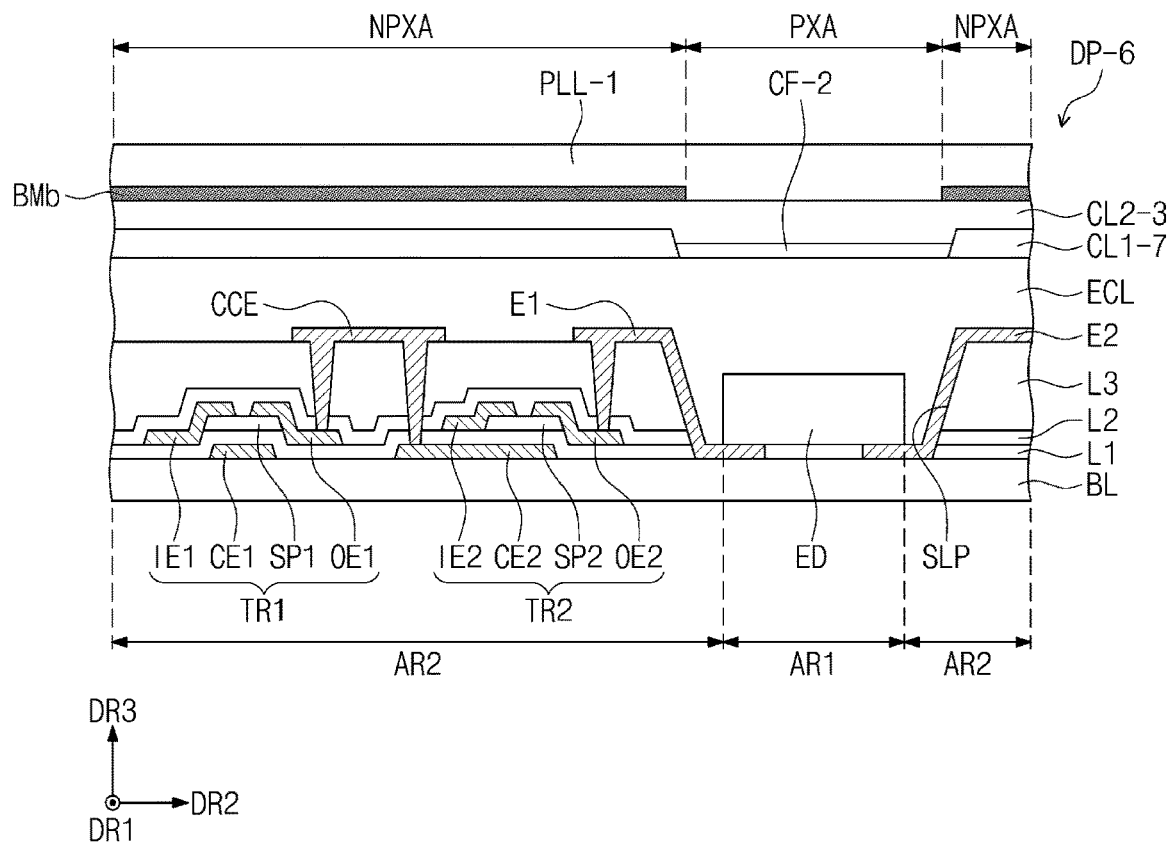
FIG. 13 is a cross-sectional view of a display panel according to an exemplary embodiment of the inventive concept.

FIG. 13 is a cross-sectional view of a display panel according to an exemplary embodiment of the inventive concept. In description of FIG. 13, only differences from FIG. 12 will be described, and description of the remaining components will be omitted.

Referring to FIG. 13, a display panel DP-6 may further include a color filter layer CF-2 and a planarization layer PLL-1.

The color filter layer CF-2 is disposed between a thin film encapsulation layer ECL and a second refraction layer CL2-3. That is, the second refraction layer CL2-3 may cover all the color filter layer CF-2 and the first refraction layer CL1-7.

The light blocking layer BMb may be disposed on the second refraction layer CL2-3, and a planarization layer PLL-1 covering the light blocking layer BMb and providing a planarization surface may be disposed on the second refraction layer CL2-3.

Figure 14:
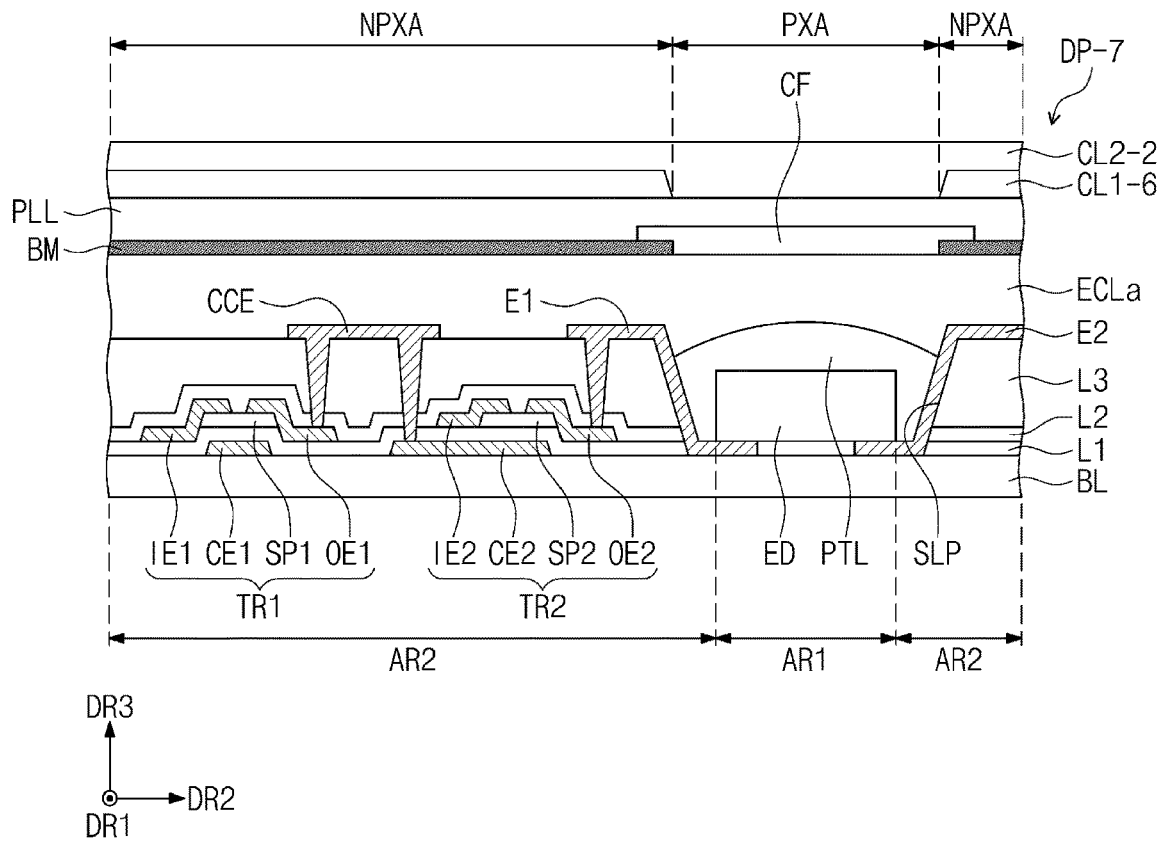
FIG. 14 is a cross-sectional view of a display panel according to an exemplary embodiment of the inventive concept.

FIG. 14 is a cross-sectional view of a display panel according to an exemplary embodiment of the inventive concept. In description of FIG. 14, the same reference numeral may be given to components that are the same as the components of FIG. 11, and their detailed descriptions will be omitted.

When compared to the display panel DP-4 of FIG. 11, a display panel DP-7 of FIG. 14 may further include a pattern layer PTL.

The pattern layer PTL is disposed below an encapsulation layer ECLa. The pattern layer PTL may overlap the first area AR1 and the light emitting element ED on the plane and cover the light emitting element ED. The pattern layer PTL may have a convex lens shape on the cross-section. The pattern layer PTL may have a refractive index larger than that of the encapsulation layer ECLa. Thus, light emitted from the light emitting element ED and incident into the encapsulation layer ECLa through the pattern layer PTL may be collected.

The pattern layer PTL may include a base material and a high-refractive index material that is capable of improving the refractive index. For example, the base material may include acrylic or siloxane. For example, the high-refractive index material may include at least one of zirconium oxide ($ZrO_X$), titanium dioxide ($TiO_2$), calcium carbonate ($CaCO_3$), silicon dioxide ($SiO_2$), zinc oxide (ZnO), magnesium hydroxide ($Mg(OH)_2$), and lithopone ($BaSO_{2+}ZnS$). The light emitted from the light emitting element ED may be primarily collected to a boundary between the pattern layer PTL and the encapsulation layer ECLa and then secondarily collected by being totally reflected or refracted by the boundary between the first refraction layer CL1-6 and a second refraction layer CL2-2, which are disposed on a planarization layer PLL. Thus, emission efficiency of the display panel DP-7 may be improved.

Figure 15:
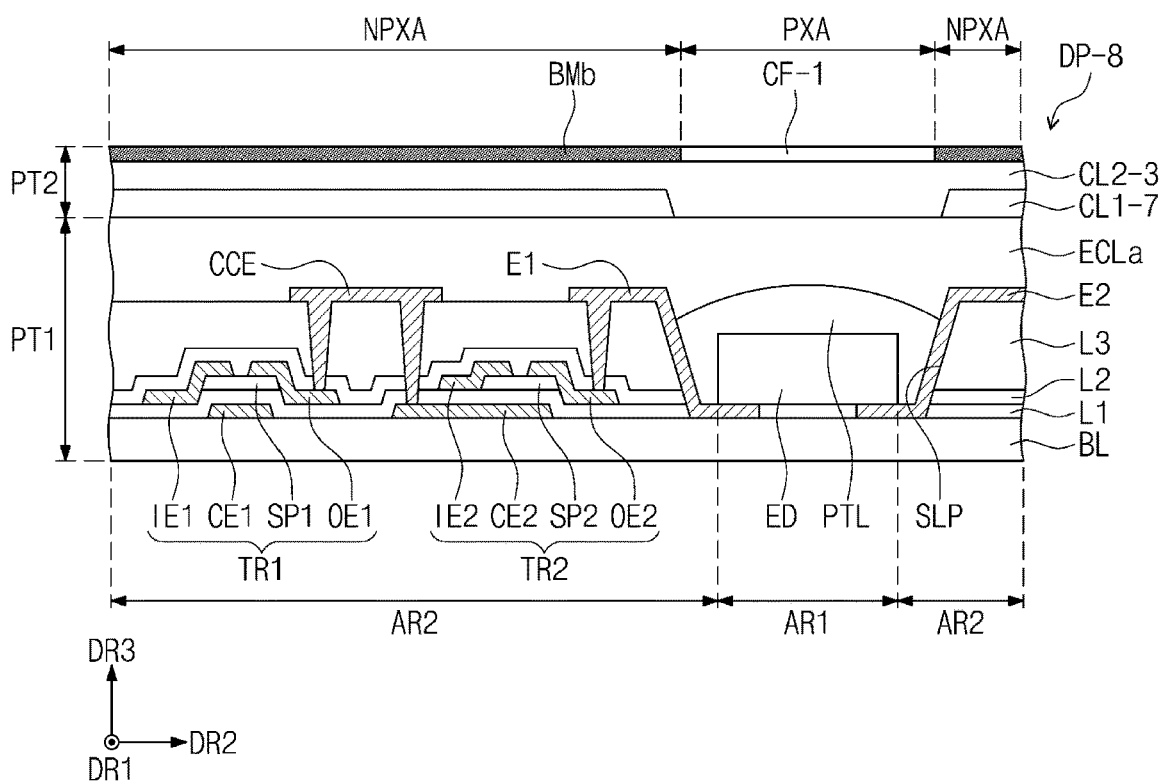
FIG. 15 is a cross-sectional view of a display panel according to an exemplary embodiment of the inventive concept.
Figure 16:
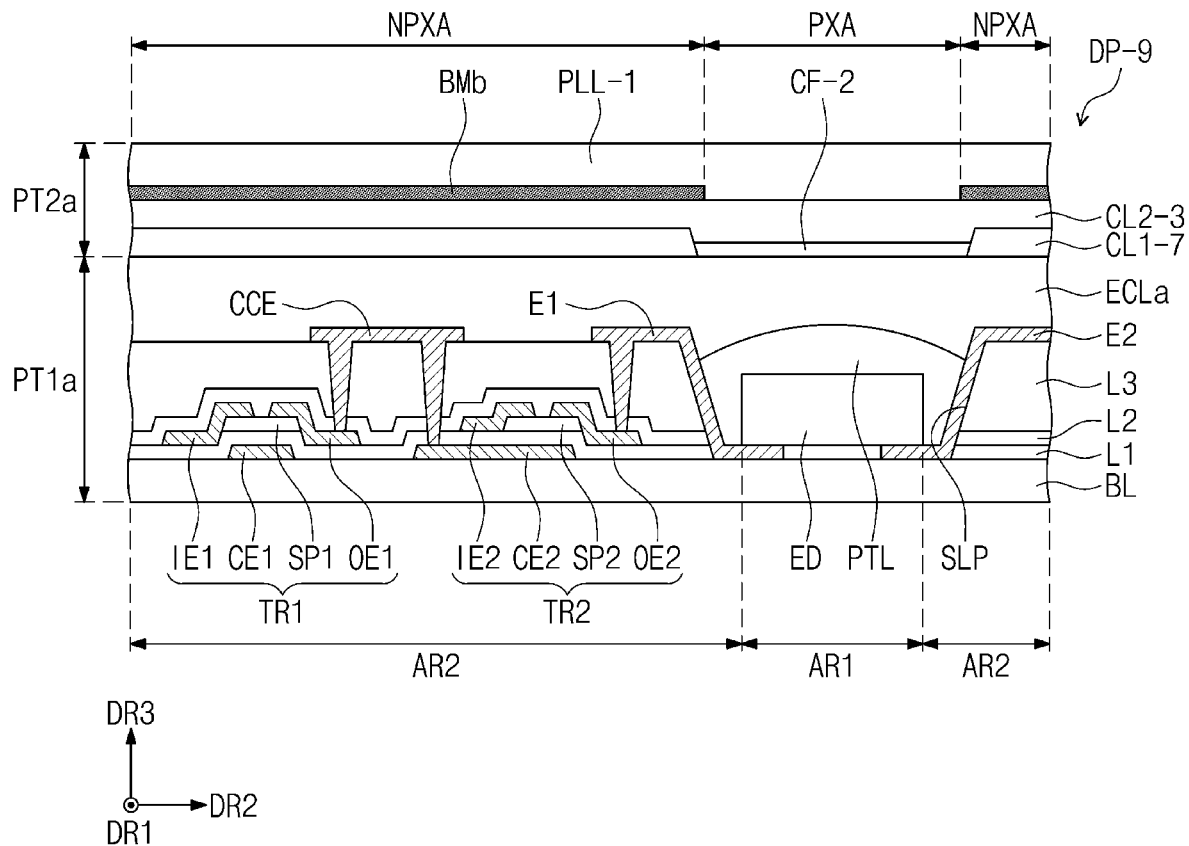
FIG. 16 is a cross-sectional view of a display panel according to an exemplary embodiment of the inventive concept.

FIGS. 15 and 16 are partial cross-sectional views of a display panel according to an exemplary embodiment of the inventive concept.

Referring to FIG. 15, a display panel DP-8 may have a configuration in which the display panel DP-5 of FIG. 12 and the display panel DP-7 of FIG. 14 are combined with each other. For example, a first portion PT1 of FIG. 15 may be the same as a portion of the constituents of the display panel DP-7 of FIG. 14, and a second portion PT2 of FIG. 15 may be the same as a portion of the constituents of the display panel DP-5 of FIG. 12.

Referring to FIG. 16, a display panel DP-9 may have a configuration in which the display panel DP-6 of FIG. 13 and the display panel DP-7 of FIG. 14 are combined with each other. For example, a first portion PT1a of FIG. 16 may be the same constituent as the display panel DP-7 of FIG. 14, and a second portion PT2a of FIG. 16 may be the same constituent as the display panel DP-6 of FIG. 13.

The display panel may have various combinations in addition to the combination of the display panels of FIGS. 15 and 16. For example, the second portions PT2 and PT2a may be replaced by the constituents of the display panel DP of FIG. 4 and the display panel DP-1 of FIG. 8.

Figure 17:
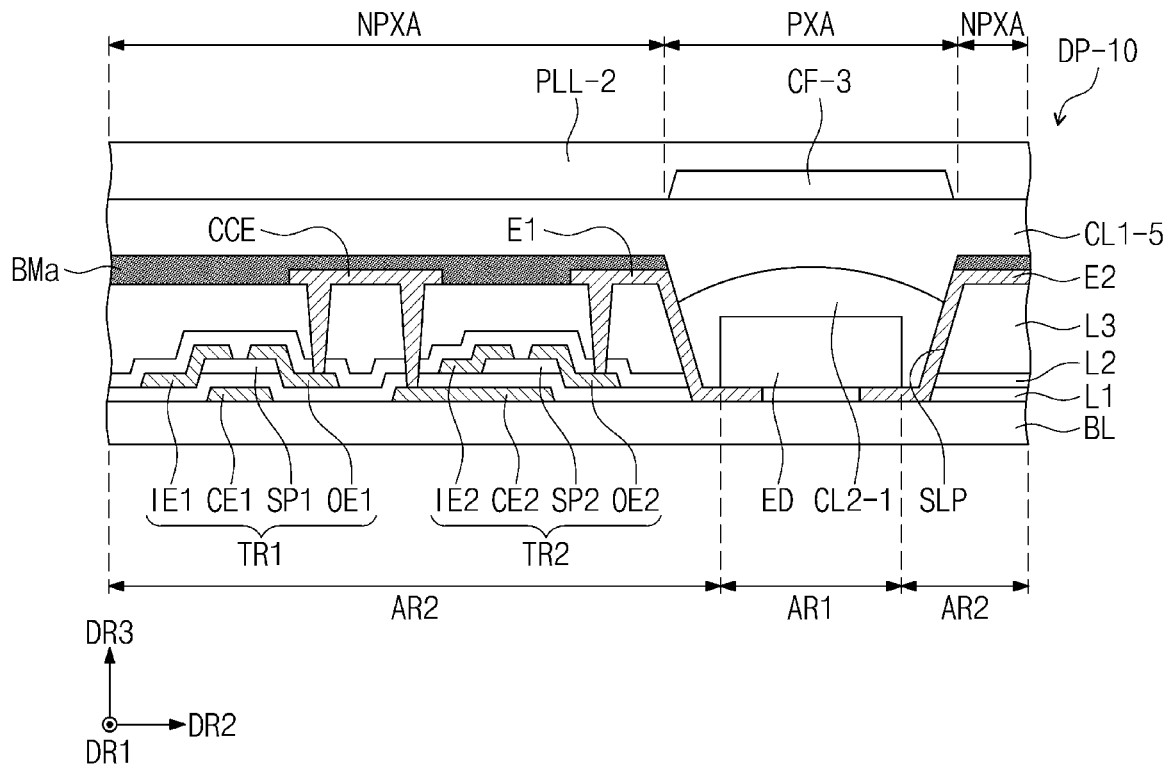
FIG. 17 is a cross-sectional view of a display panel according to an exemplary embodiment of the inventive concept.

FIG. 17 is a cross-sectional view of a display panel according to an exemplary embodiment of the inventive concept. In FIG. 17, the differences from the constituents of FIG. 10 will be described. The same reference numerals are used for the same constituent, and a description thereof will be omitted.

When compared to the display panel DP-3 of FIG. 10, a display panel DP-10 of FIG. 17 may further include a color filter layer CF-3 and a planarization layer PLL-2.

The color filter layer CF-3 may be disposed on a first refraction layer CL1-5 and disposed to overlap the first area AR1 and the light emitting element ED on the plane. The planarization layer PLL-2 may be disposed on the first refraction layer CL1-5 to cover the color filter layer CF-3.

Figure 18:
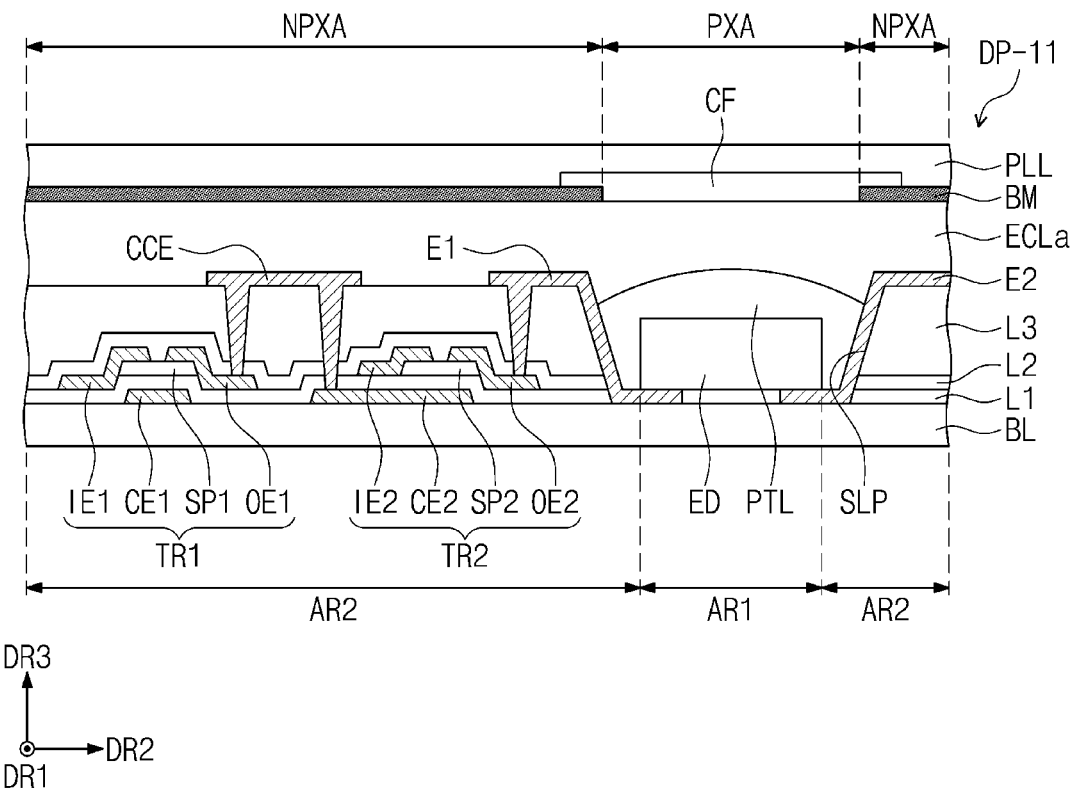
FIG. 18 is a cross-sectional view of a display panel according to an exemplary embodiment of the inventive concept.

FIG. 18 is a cross-sectional view of a display panel according to an exemplary embodiment of the inventive concept.

A display panel DP-11 of FIG. 18 may have the same structure as that of the display panel DP-7 of FIG. 14 in which the first refraction layer CL1-6 and the second refraction layer CL2-2 are omitted. A pattern layer PTL covering the light emitting element ED may have substantially the same constituent as the second refraction layer CL2-1 of FIG. 10. Since the first refraction layer CL1-6 and the second refraction layer CL2-2 are omitted, display panel DP-11 may be made thinner.

The pattern layer PTL of FIG. 18 may be called a second refraction layer, and an encapsulation layer ECLa may be called a first refraction layer. The pattern layer PTL may be substantially the same as the second refraction layer CL2-1 of FIG. 10, and the encapsulation layer ECLa may be substantially the same as the first refraction layer CL1-5 of FIG. 10.

Figure 19:
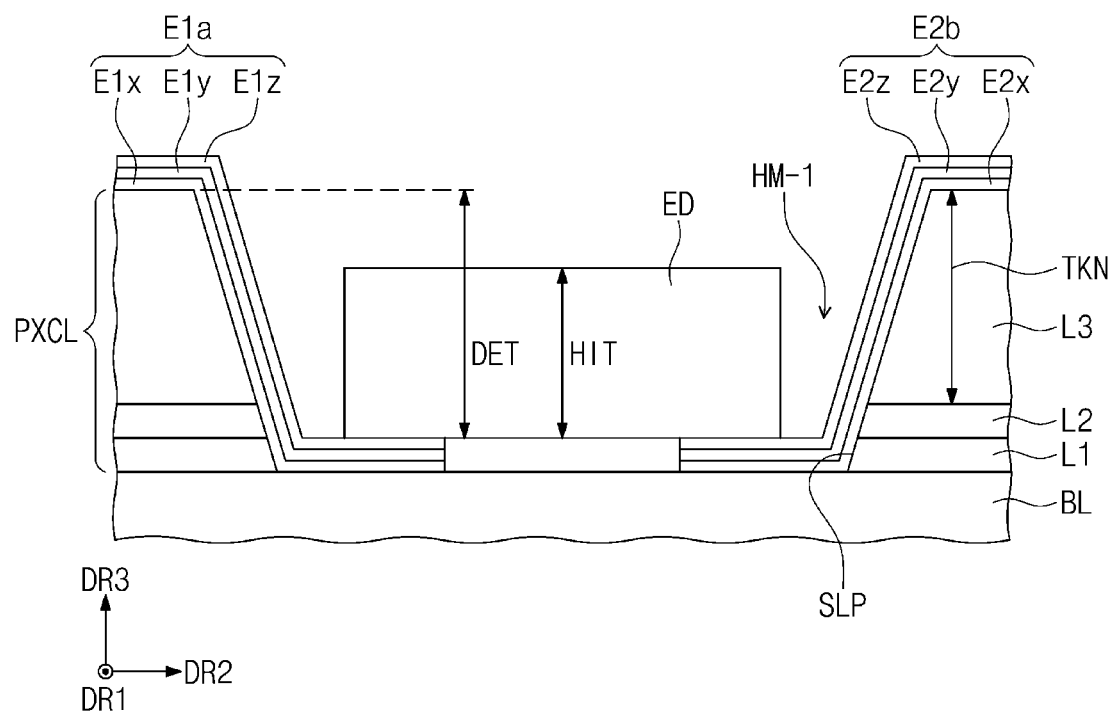
FIG. 19 is an enlarged cross-sectional view illustrating a portion of the display device according to an exemplary embodiment of the inventive concept.

FIG. 19 is an enlarged cross-sectional view illustrating a portion of the display device according to an exemplary embodiment of the inventive concept.

Referring to FIG. 19, a groove HM-1 may be defined in the pixel circuit layer PXCL. The groove HM-1 may be defined by an inclined part SLP including ends of the first to third insulation layers L1, L2, and L3.

An inclined part SLP defined at one side with respect to the light emitting element ED may be covered by a first electrode E1a, and an inclined part SLP defined at the other side may be covered by a second electrode E2b.

Each of the first electrode E1a and the second electrode E2b may have a multilayered structure. The first electrode E1a may include a first electrode layer E1x, a second electrode layer E1y, and a third electrode layer E1z, which are sequentially laminated, and the second electrode E2b may include a first electrode layer E2x, a second electrode layer E2y, and a third electrode layer E2z, which are sequentially laminated.

Each of the first electrode layer E1x, the third electrode layer E1z, the first electrode layer E2x, and the third electrode layer E2z may include indium tin oxide (ITO), and the second electrode layer E1y and the second electrode layer E2y may include a reflective material, for example, silver (Ag). Thus, light emitted from the light emitting element ED may be reflected by the first electrode E1a and the second electrode E2b.

In an exemplary embodiment of the inventive concept, the groove HM-1 may have a depth DET greater than a thickness HIT of the light emitting element ED. A thickness TKN of the third insulation layer L3 may be adjusted according to the thickness of the light emitting element ED to adjust the depth DET of the groove HM-1. The light emitting element ED may be completely accommodated in the groove HM-1. Thus, light provided from the light emitting element ED may be reflected by the first electrode E1a and the second electrode E2b. Thus, emission efficiency of the display panel DP (see FIG. 4) may be improved.

In another exemplary embodiment of the inventive concept, light emitted from the light emitting element ED may be reflected by the first electrode E1a and the second electrode E2b to sufficiently control the light path. Thus, the first refraction layers and the second refraction layers, which are described above, may be omitted. In addition, in another exemplary embodiment of the inventive concept, the light blocking layer may not be disposed on the substrate on which the light emitting element ED is disposed, but may instead be disposed on a different substrate. For example, the light blocking layer may be disposed on an opposite substrate facing the light emitting element ED. In this case, the opposite substrate may be a rigid substrate, for example, a glass substrate.

According to the inventive concept, the display device may include the first refraction layer having the first refractive index and the second refraction layer having the second refractive index larger than the first refractive index. The light emitted from the light emitting element of the display device may be refracted or totally reflected by the boundary between the first refraction layer and the second refraction layer to change the light path. The emission efficiency of the display device may be improved by the changed light path.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a base layer;
a pixel circuit layer disposed on the base layer and comprising a transistor and insulation layers, each of the insulation layers having a groove;
a first electrode electrically connected to the transistor;
a second electrode spaced apart from the first electrode and configured to receive a power source voltage;
a light emitting element electrically connected to the first electrode and the second electrode and disposed in the groove;
a first refraction layer overlapping an area adjacent to an emission area on which the light emitting element is disposed and having a first refractive index; and
a second refraction layer overlapping the emission area and having a second refractive index larger than the first refractive index.

2. The display device of claim 1, wherein:
the first refraction layer is disposed on the pixel circuit layer; and
the second refraction layer is disposed on the first refraction layer to cover the first refraction layer and provide a planarization surface.

3. The display device of claim 1, wherein:
the second refraction layer is disposed on the light emitting element; and
the first refraction layer is disposed on the second refraction layer to cover the second refraction layer and provide a planarization surface.

4. The display device of claim 1, wherein:
the groove is defined by an inclined part comprising an end of each of the insulation layers;
the first electrode covers one portion of the inclined part;
the second electrode covers the other portion of the inclined part; and
each of the first electrode and the second electrode comprises a reflective material.

5. The display device of claim 1, wherein the groove has a depth greater than a thickness of the light emitting element.

* * * * *